United States Patent
Kojima et al.

(10) Patent No.: US 8,026,537 B2
(45) Date of Patent: Sep. 27, 2011

(54) SEMICONDUCTOR INTEGRATED CIRCUIT HAVING AN OBLIQUE GLOBAL SIGNAL WIRING AND SEMICONDUCTOR INTEGRATED CIRCUIT WIRING METHOD

(75) Inventors: Naohito Kojima, Kanagawa (JP); Fumihiro Minami, Kanagawa (JP); Kimiyoshi Usami, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 377 days.

(21) Appl. No.: 11/763,432

(22) Filed: Jun. 14, 2007

(65) Prior Publication Data
US 2007/0235766 A1    Oct. 11, 2007

Related U.S. Application Data

(62) Division of application No. 10/762,156, filed on Jan. 20, 2004, now abandoned.

(30) Foreign Application Priority Data

Jan. 20, 2003 (JP) ................ P2003-011631

(51) Int. Cl.
*H01L 27/10* (2006.01)
(52) U.S. Cl. .............. 257/208; 257/210; 257/211
(58) Field of Classification Search .............. 257/208, 257/210, 211
See application file for complete search history.

(56) References Cited

U.S. PATENT DOCUMENTS 6,262,487 B1    7/2001 Igarashi et al.
6,436,804 B2    8/2002 Igarashi et al.

FOREIGN PATENT DOCUMENTS

| JP | 64-042146 | 2/1989 |
|---|---|---|
| JP | 04-054676 | 2/1992 |
| JP | 05-243379 | 9/1993 |
| JP | 05-326835 | 12/1993 |
| JP | P11-145292 | 5/1999 |
| JP | 11-177029 | 7/1999 |
| JP | 2000-082743 | 3/2000 |
| JP | 2001-144183 | 5/2001 |
| JP | P2001-142931 A | 5/2001 |
| JP | 2002-237522 | 8/2002 |

OTHER PUBLICATIONS

Official Action Letter issued May 29, 2007 in counterpart Japanese application with English translation.

*Primary Examiner* — Ori Nadav
(74) *Attorney, Agent, or Firm* — DLA Piper LLP (US)

(57) ABSTRACT

A semiconductor integrated circuit includes a function block arranged on a substrate, a first buffering cell arranged adjacent to a first side of the function block, a second buffering cell arranged adjacent to a second side adjacent to the first side of the function block, and signal wiring passing over the function block obliquely relative to the first side and the second side, connecting the first buffering cell and the second buffering cell.

21 Claims, 16 Drawing Sheets

SEMICONDUCTOR INTEGRATED CIRCUIT HAVING AN OBLIQUE GLOBAL SIGNAL WIRING AND SEMICONDUCTOR INTEGRATED CIRCUIT WIRING METHOD

CROSS REFERENCE TO RELATED APPLICATIONS

This is a division of application Ser. No. 10/762,156, filed Jan. 20, 2004, now abandoned publishing as US2004/0183103A1, which is based upon and claims the benefit of priority from the prior Japanese Patent Applications No. P2003-011631, filed on Jan. 20, 2003; the entire contents of all of which are incorporated herein by reference.

BACKGROUND OF THE INVENTION

1. Field of the Invention

The present invention relates to a semiconductor integrated circuit and the fabrication method, particularly to the semiconductor integrated circuit that comprises a function block and a global signal wiring, and the fabrication method.

2. Description of the Related Art

The following design techniques are generalized for high-speed, large scale integrated circuit (LSI) design. To begin with, a circuit employed in a semiconductor integrated circuit is converted into hard macro blocks (function blocks) each corresponding to a function. The function blocks are then automatically arranged upon the semiconductor integrated circuit substrate, and the terminals of each function block are electrically connected to other circuits through wiring. This type of design is executed using a computer aided design (CAD) system.

Here, the semiconductor integrated circuit includes at least an integrated circuit that employs standard cell method and an application specific integrated circuit (ASIC) or the like. A wire herein means a signal wiring having a relatively long length passing across the entire substrate, such as a data bus through which transmission/reception of a data signal is performed between function blocks or with another circuit, or an address bus through which transmission/reception of an address signal is performed. Such a signal wiring is typically called a global signal wiring. Furthermore, the substrate during the design phase means a virtual substrate constructed in a memory space of the CAD system, and corresponds to a real semiconductor substrate or a real semiconductor chip of an actual product (a semiconductor integrated circuit).

Since the number of wiring layers is limited in semiconductor integrated circuit design, when the areas above the function blocks are set as prohibition areas for the global signal wirings, the global signal wirings must bypass the function block perimeter. When the size of the function blocks is extremely large relative to the substrate size, the necessary length of the global signal wirings for bypassing is extremely long. The increased global signal wiring length may cause an operation timing error (a timing violation), requiring redesigning.

In order to avoid an increase in wiring lengths, a design method of limiting the wiring layers utilized for connecting within the function block to only a few layers from the bottom layer upward, and allocating global signal wirings to the upper wiring layers could be employed. According to this design method, the global signal wirings may pass over the function block.

However, the following problems are not taken into account in such a semiconductor integrated circuit design method.

The global signal wirings may pass over the function block with the above design method; however additional buffering cells may not be arranged inside the function block in accordance with the global signal wiring passing route. In this case, the buffering cell is a circuit (intermediate cell) that amplifies a signal (increases driving capability) to be propagated through a global signal wiring.

Furthermore, since arrangement of buffering cells within the function block is impossible, arrangement of a buffering cell outside of the function block in the vicinity of each facing side of the function block, and connecting these buffering cells by means of the global signal wiring that passes over the function block is needed. Nevertheless, in the case of a function block of a huge size, the length of the global signal wiring that passes over the function block is extremely long, and the wiring capacitance thereof increases. Even if a buffering cell of high drive ability is arranged, the signal rising/falling time falls outside of design rule limitations, and timing error occurs. That is to say, the wiring length that a buffering cell can drive has a limit. So, in the case of a function block of a huge size, since a global signal wiring that passes over the function block cannot be arranged, a global signal wiring that bypasses the function block must be arranged.

Therefore, as shown in FIG. 1, basic structure of a semiconductor integrated circuit according to a related art includes a function block 2 upon a substrate 1, a first buffering cell 3a, which is arranged in the vicinity of a first side 2a of the function block 2, a second buffering cell 3b1 and a third buffering cell 3b2, which is arranged in the vicinity of a second side 2b adjacent to the first side 2a, and a fourth buffering cell 3c, which is arranged in the vicinity of a third side 2c adjacent to the second side 2b. The first buffering cell 3a and the second buffering cell 3b1 are connected by signal wiring 4a that bypasses the function block 2. The second buffering cell 3b1 and the third buffering cell 3b2 are connected by signal wiring 4b. The third buffering cell 3b2 and the fourth buffering cell 3c are connected by signal wiring 4c that bypasses the function block 2. When global signal wiring to bypass the function block 2 is long, by reason of a limit to the wiring length that buffering cell 3a to 3c can drive, it is necessary to arrange a plurality of buffering cells between the first buffering cell 3a and the fourth buffering cell 3c.

It should be noted that this type of semiconductor integrated circuit design method is disclosed in U.S. Pat. No. 6,436,804 B2.

SUMMARY OF THE INVENTION

An aspect of the present invention inheres in a semiconductor integrated circuit including a function block arranged on a substrate; a first buffering cell arranged adjacent to a first side of the function block, a second buffering cell arranged adjacent to a second side adjacent to the first side of the function block; and signal wiring passing over the function block obliquely relative to the first side and the second side, connecting the first buffering cell and the second buffering cell.

Another aspect of the present invention inheres in a semiconductor integrated circuit including a function block arranged on a substrate; a plurality of signal wirings having a length shorter than a length of a side of the function block on the substrate; a plurality of buffering cells electrically connected in series between each of the signal wirings; and a signal wiring passing obliquely across the corner between a first side and a second side of the function block, which connects the buffering cells arranged adjacent to the first side and adjacent to the second side adjacent to the first side of the function block.

Still another aspect of the present invention inheres in a semiconductor integrated circuit including a function block arranged on a substrate; a plurality of buffering cells arranged regularly in the function block at an appointed interval; and a signal wiring extending obliquely relative to a side of the function block, which is connected between adjacent buffering cells.

Yet still another aspect of the present invention inheres in a method of manufacturing a semiconductor integrated circuit, including arranging a function block on a substrate; arranging a signal wiring which passes over the function block obliquely relative to a first side and a second side adjacent to the first side of the function block; and arranging a first buffering cell connected to one end of the signal wiring, adjacent to the first side of the function block and a second buffering cell connected to another end of the signal wiring, adjacent to the second side of the function block.

Further aspect of the present invention inheres in a method of manufacturing a semiconductor integrated circuit, including arranging a plurality of function blocks on a substrate; extracting a first function block with minimum signal loss in the function blocks in a signal wiring route; extracting a second function block arranged near the first function block; arranging a signal wiring which passes obliquely relative to a first side and a second side adjacent to the first side of the second function block; determining whether a length of the signal wiring exceeds the signal wiring length limitation; determining whether a signal timing satisfies at least a design rule when the length of the signal wiring exceeds the signal wiring length limitation; determining whether a buffering cell can be arranged when the signal timing fails to satisfy the design rule; and arranging a first buffering cell connected to one end of the signal wiring, adjacent to the first side of the second function block and a second buffering cell connected to another end of the signal wiring, adjacent to the second side of the second function block.

DETAILED DESCRIPTION OF THE INVENTION

Figure 1:
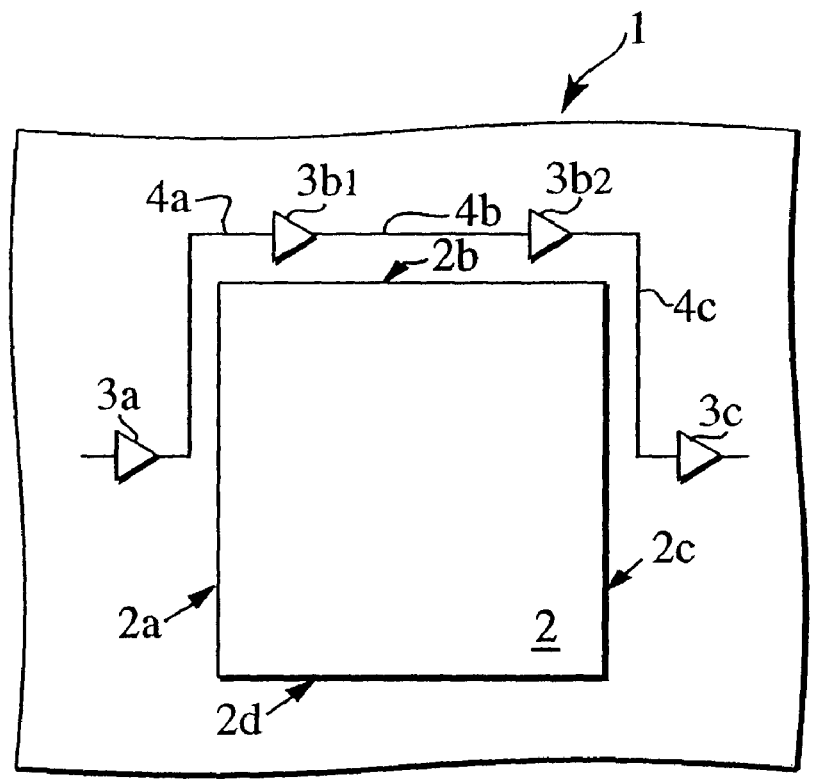
FIG. 1 is a schematic view showing a basic structure of a semiconductor integrated circuit in the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure.

In the following descriptions, numerous specific details are set fourth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

First Embodiment

First Basic Structure of a Semiconductor Integrated Circuit

Figure 2:
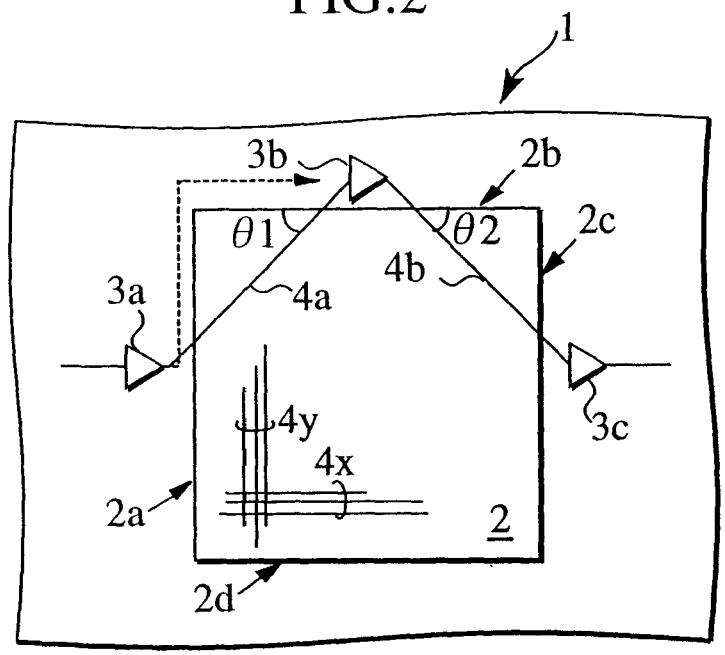
FIG. 2 is a schematic view showing a first basic structure of a semiconductor integrated circuit according to a first embodiment of the present invention.

As shown in FIG. 2, a first basic structure of a semiconductor integrated circuit according to a first embodiment of the present invention includes a function block 2 arranged on a substrate 1, a first buffering cell 3a, which is arranged in the vicinity of or adjacent to a first side 2a of the function block 2, a second buffering cell 3b, which is arranged in the vicinity of or adjacent to a second side 2b adjacent to the first side 2a, and a signal wiring 4a, which passes over the function block 2 obliquely relative to the first side 2a and the second side 2b, connecting the first buffering cell 3a and the second buffering cell 3b.

Similarly, the semiconductor integrated circuit includes the function block 2 upon the substrate 1, the second buffering cell 3b, which is arranged in the vicinity of or adjacent to the second side 2b of the function block 2, a third buffering cell 3c, which is arranged in the vicinity of or adjacent to a third side 2c adjacent to the second side 2b, and a signal wiring 4b, which passes over the function block 2 obliquely relative to the second side 2b and the third side 2c, connecting the second buffering cell 3b and the third buffering cell 3c.

In other words, the semiconductor integrated circuit includes the function block 2 upon the substrate 1, a plurality of the signal wirings 4a and 4b, which have a shorter length than the length of sides 2a through 2d of the function block 2, and a plurality of the buffering cells 3a to 3c, which are electrically connected in series between each of a plurality of the signal wirings 4a and 4b, and also includes at least a signal wiring 4a, which connects the buffering cells 3a and 3b arranged in the vicinity of or adjacent to the first side 2a and the second side 2b adjacent to this first side 2a of the function block 2, and passes obliquely across the corner between the first side 2a and the second side 2b of the function block 2. The arrangement structure for each of the function block 2, the buffering cells 3b and 3c, and the signal wiring 4b is also the same.

The semiconductor integrated circuit according to the first embodiment herein is a semiconductor integrated circuit that employs standard cell method and ASIC or the like, which are designed using a CAD system.

The photo masks are made based on this design data, and a semiconductor integrated circuit is fabricated as an actual product by a semiconductor fabrication process using these photo masks.

The substrate 1 is a semiconductor substrate (semiconductor chip) of, for example, a silicon single crystal or a compound semiconductor with an actual product. The substrate 1 is a virtual substrate that is constructed in a memory space of the CAD system during the design phase.

The function block 2 is a circuit block having one or a plurality of specific functions, a logic function, a calculation function, a memory function or the like, and is a mega cell, a macro cell, a mega block, a macro block or the like. The function block 2, in the CAD system design, is stored in a database as a piece of parts data, and can be freely arranged and rearranged on the substrate. More concretely, a central processing unit (CPU), read only memory (ROM) or random access memory (RAM) or the like corresponds to the function block 2.

With this semiconductor integrated circuit, intra-block wirings 4x and 4y are typically arranged inside the function block 2 and other circuit blocks, but are not limited to being arranged only in this region. The intra-block wirings 4x and 4y are used to connect semiconductor devices such as transistors, resistors, capacitors and diodes that configure the function block 2, and may also connect circuits configured with semiconductor devices, and may further be used as power supply wiring, which supply power to the semiconductor devices and circuits. In the multi-level wiring structure employed by the semiconductor integrated circuit, the intra-block wirings 4x and 4y are allocated to several layers from the bottom layer upward on the substrate 1 side. For example, the intra-block wiring 4x is allocated to the first wiring layer (and/or the third wiring layer) extending in an X direction substantially parallel to the second side 2b and the fourth side 2d of the function block 2. The intra-block wiring 4y is allocated to the second wiring layer (and/or the fourth wiring layer) extending in a Y direction substantially parallel to the first side 2a and the third side 2c of the function block 2. The intra-block wirings 4x and 4y are electrically connected by connecting-hole interconnects such as through-hole interconnects or via interconnects not shown in the drawings.

The intra-block wirings 4x and 4y are made of, for example, a low resistant wiring material such as aluminum (Al), an aluminum alloy (Al—Si, Al—Cu, Al—Cu—Si or the like), copper (Cu), or a copper alloy. It should be noted that the intra-block wiring 4x is exemplary 'first signal wiring' according to the present embodiment, and the intra-block wiring 4y is exemplary 'second signal wirings' according to the present embodiment.

The signal wirings 4a and 4b are arranged across the entire substrate, and are part of the signal wiring that passes over the function block 2 as the long global signal wiring. Signals to be propagated through the signal wirings 4a and 4b are important for providing circuit operation timing for data signals and address signals in the entire semiconductor integrated circuit. The signal wirings 4a and 4b being arranged in, for example, the third wiring layer (or the fifth wiring layer), which is a layer higher than the intra-block wirings 4x and 4y, is practical for passing obliquely over the function block 2. Furthermore, with the first basic structure, the signal wiring 4a may be arranged in the third wiring layer (or the fifth wiring layer), and the signal wiring 4b may be arranged in the fourth wiring layer (or the sixth wiring layer). Moreover, the signal wiring 4a may be arranged in the fourth wiring layer (or the sixth wiring layer), and the signal wiring 4b may be arranged in the third wiring layer (or the fifth wiring layer). The wiring material for the signal wirings 4a and 4b is the same as that for the intra-block wirings 4x and 4y, for example. It should be noted that the signal wirings 4a and 4b are exemplary 'signal wiring' according to the present embodiment.

With the semiconductor integrated circuit according to the first embodiment, an angle θ1 of the signal wiring 4a relative to the second side 2b of the function block 2 or the intra-block wiring 4x extending direction (wiring length direction) is set to 45 degrees. Obliquely arranging the signal wiring 4a as a signal wiring as such allows the signal wiring 4a length to be shortened to approximately $1/\sqrt{2}$ rather than when bypassing along the first side 2a and the second side 2b as indicated by a dotted wiring in FIG. 2. Similarly, an angle θ2 of the signal wiring 4b relative to the second side 2b of the function block 2 or the intra-block wirings 4x extending direction is set to 45 degrees. The signal wiring 4b may also have its length shortened to approximately $1/\sqrt{2}$.

As described above, the wiring length that the buffering cells 3a to 3c can drive has a limit. Therefore, it is necessary to arrange at least two buffering cells in between the buffering cell 3a and the buffering cell 3c, when the wiring length that the buffering cells 3a to 3c can drive is larger than 2 times of the sum of length in the case of the signal wirings 4a and 4b bypassing the circuit block 2. However, if the signal wirings 4a and 4b are oblique wiring, the sum of wiring length of the signal wirings 4a and 4b is shortened, and as a result, the number of buffering cell can be reduced.

Moreover, an insertion pitch for the buffering cells 3a to 3c to be electrically inserted in series for every constant wiring length may also be shortened to approximately $1/\sqrt{2}$ along with the shortening of the lengths of the signal wirings 4a and 4b. In other words, the lengths of the respective signal wirings 4a and 4b become equivalent to the insertion pitch for the buffering cells 3a to 3c. For example, in the case of the size of the substrate 1 being a 10 mm square, the lengths of the respective signal wirings 4a and 4b may be set to 2 mm, and the insertion pitch for the buffering cells 3a to 3c may be set to 2 mm.

It should be noted that with the semiconductor integrated circuit according to the first embodiment, the buffering cells 3a to 3c are arranged outside of the function block 2. Basic cells not shown in the drawing that can configure a specific basic circuit such as an inverter circuit or a NAND circuit are arranged outside of this function block 2 in the design phase of the CAD system, and the buffering cells 3a to 3c are configured with those basic cells. The detailed structure of the buffering cells 3a to 3c is described later.

With the first basic structure of the semiconductor integrated circuit according to the first embodiment structured in this manner, the buffering cells 3a and 3b are arranged in the vicinity of or adjacent to the adjacent first side 2a and the second side 2b of the function block 2, respectively, and the signal wiring 4a, which is connected to these buffering cells 3a and 3b so as to pass obliquely over the function block 2, is arranged; thus, the wiring length of the signal wiring 4a may be shortened, and the wiring capacitance may be reduced. Moreover, the driving capability of the buffering cell 3a may be relatively increased as the wiring capacitance reduces. Similarly, the buffering cells 3b and 3c are arranged in the vicinity of or adjacent to the adjacent second side 2b and the third side 2c of the function block 2, respectively, and the signal wiring 4b, which is connected to these buffering cells 3b and 3c so as to pass obliquely over the function block 2, is arranged; thus, the wiring length of the signal wiring 4b may be shortened, and the wiring capacitance may be reduced. Moreover, the driving capability of the buffering cell 3b may be relatively increased as the wiring capacitance reduces. Accordingly, since the global signal wiring that bypasses the function block 2 may be reduced, and signal delay may be prevented, a semiconductor integrated circuit with excellent operating capability that is optimum for high integration can be obtained.

It should be noted that with the semiconductor integrated circuit according to the first embodiment, both the angle θ1 of the signal wiring 4a and the angle θ2 of the signal wiring 4b are set to 45 degrees and those signal wirings pass over the function block 2, however, the present embodiment is not limited to this angle. The present embodiment may set the angles θ1 and θ2 to 30 degrees or 60 degrees, for example. In any case, the angles θ1 and θ2 may be appropriately selected considering that they are manageable angles in the CAD system, the sufficient fabrication process yield of the semiconductor integrated circuit can be ensured, and such above-mentioned sufficient results can be obtained.

Second Basic Structure of a Semiconductor Integrated Circuit

Figure 3:
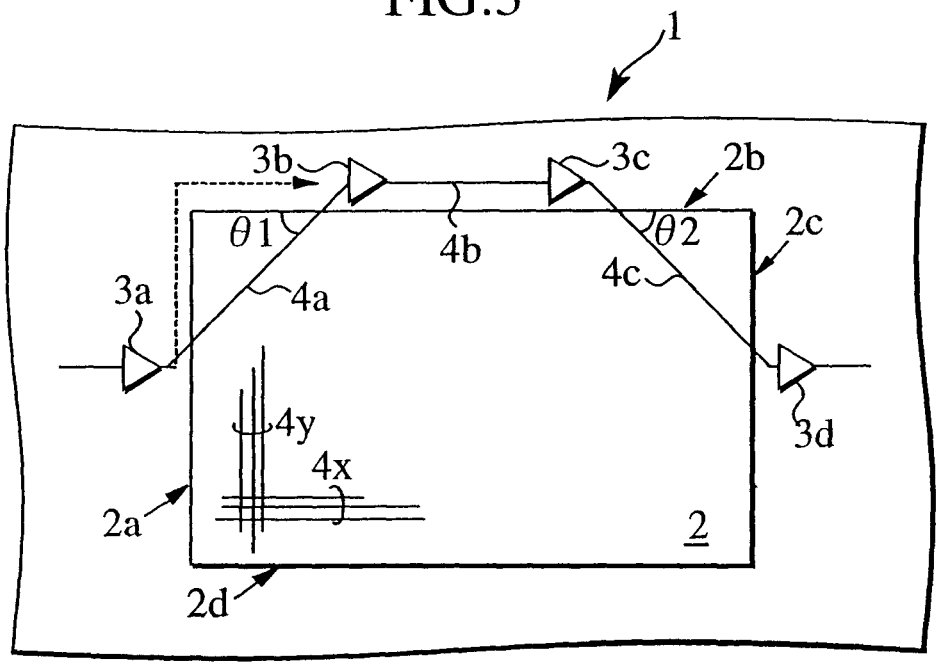
FIG. 3 is a schematic view showing a second basic structure of the semiconductor integrated circuit according to the first embodiment of the present invention.

A second basic structure of the semiconductor integrated circuit according to the first embodiment will be described using an example including a function block 2 with a form different than that of the function block 2 with the first basic structure. As shown in FIG. 3, the semiconductor integrated circuit includes the function block 2 upon the substrate 1, the first buffering cell 3a, which is arranged in the vicinity of or adjacent to the first side 2a of the function block 2, the second buffering cell 3b, which is arranged in the vicinity of or adjacent to the second side 2b adjacent to the first side 2a, and the signal wiring 4a, which passes obliquely over the function block 2 relative to the first side 2a and the second side 2b, connecting the first buffering cell 3a and the second buffering cell 3b.

Similarly, the semiconductor integrated circuit includes the function block 2 upon the substrate 1, the third buffering cell 3c, which is arranged in the vicinity of or adjacent to the second side 2b of the function block 2, a fourth buffering cell 3d, which is arranged in the vicinity of or adjacent to the third side 2c adjacent to the second side 2b, and a signal wiring 4c, which passes obliquely over the function block 2 relative to the second side 2b and the third side 2c, connecting the third buffering cell 3c and the fourth buffering cell 3d.

The function block 2 with the second basic structure has either a larger planar size than that of the function block 2 with the first basic structure, or an oblong planar form with the second side 2b longer than the first side 2a. In other words, the function block 2 having at least the second side 2b sufficiently longer than the length of each of the signal wirings 4a to 4c, which are global signal wirings, is arranged in the semiconductor integrated circuit.

With the semiconductor integrated circuit including this function block 2, the signal wiring 4a, which is the same as signal wiring 4a with the first basic structure, and the signal wiring 4c, which is the same as signal wiring 4b with the first basic structure, pass obliquely over the function block 2, and the signal wiring 4b is arranged outside of the function block 2 substantially parallel to the second side 2b. On the outside of the function block 2, the signal wiring 4b connects the buffering cells 3b and 3c, which are arranged along the second side 2b apart from each other.

It is practical to arrange the signal wirings 4a, 4b and 4c in the same wiring layer (for example, the third or the fifth wiring layer) as in the first basic structure. Furthermore, each of the signal wirings 4a, 4b and 4c may be arranged in a separate wiring layer. Moreover, arranging the signal wirings 4a and 4c in the same wiring layer, and the signal wiring 4b in a separate wiring layer from the signal wirings 4a and 4c is also possible.

The same results as obtained with the first basic structure can be obtained with the second basic structure of the semiconductor integrated circuit according to the first embodiment configured in this manner.

Third Basic Structure of a Semiconductor Integrated Circuit

Figure 4:
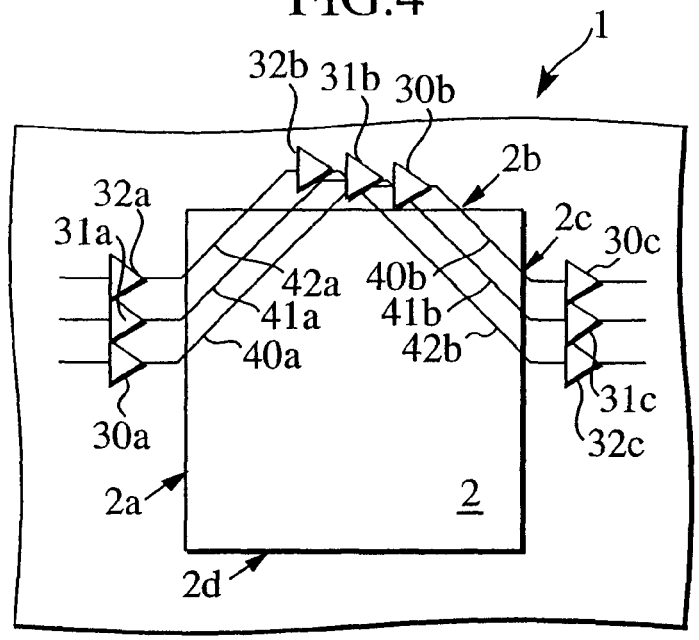
FIG. 4 is a schematic view showing a third basic structure of the semiconductor integrated circuit according to the first embodiment of the present invention.

A third basic structure of the semiconductor integrated circuit according to the first embodiment is for describing an example where the signal wirings 4a and 4b with the first basic structure are bus signal wiring. As shown in FIG. 4, the semiconductor integrated circuit includes the function block 2 upon the substrate 1, first buffering cells 30a to 32a, which are arranged in the vicinity of the first side 2a of the function block 2, second buffering cells 30b to 32b, which are arranged in the vicinity of the second side 2b adjacent to the first side 2a, and signal wirings 40a to 42a, which pass obliquely over the function block 2 relative to the first side 2a and the second side 2b, connecting the first buffering cells 30a to 32a and the second buffering cells 30b to 32b, respectively.

Similarly, the semiconductor integrated circuit includes the function block 2 upon the substrate 1, the second buffering cells 30b to 32b, which are arranged in the vicinity of the second side 2b of the function block 2, third buffering cells 30c to 32c, which are arranged in the vicinity of the third side 2c adjacent to the second side 2b, and signal wirings 40b to 42b, which pass obliquely over the function block 2 relative to the second side 2b and the third side 2c, connecting the second buffering cells 30b to 32b and the third buffering cells 30c to 32c, respectively.

The planar shape of the function block 2 with the third basic structure is the same shape as that of the function block 2 with the first basic structure. Part of the signal wirings 40a to 42a and 40b to 42b of the global signal wirings such as data buses and address buses pass over the function block 2.

With the third basic structure shown in FIG. 4, since the buffering cells 30b to 32b are aligned in the X direction along the second side 2b, crossing wirings are necessary, and thus it is practical to arrange the signal wirings 40 to 42a and the signal wirings 40b to 42b in different wiring layers. It should be noted that when the buffering cells 30b to 32b are aligned in the Y direction, crossing wiring is not necessary, and thus the signal wirings 40a to 42a and the signal wirings 40b to 42b may be arranged in the same wiring layer.

The same results as obtained with the first basic structure can be obtained with the third basic structure of the semiconductor integrated circuit according to the first embodiment configured in this manner.

It should be noted that three signal wirings 40a to 42a and signal wirings 40b to 42b have been described with the third basic structure in order to simplify the description, however, there may be two, four or more signal wirings. This is the same for a fourth basic structure described later.

Fourth Basic Structure of a Semiconductor Integrated Circuit

Figure 5:
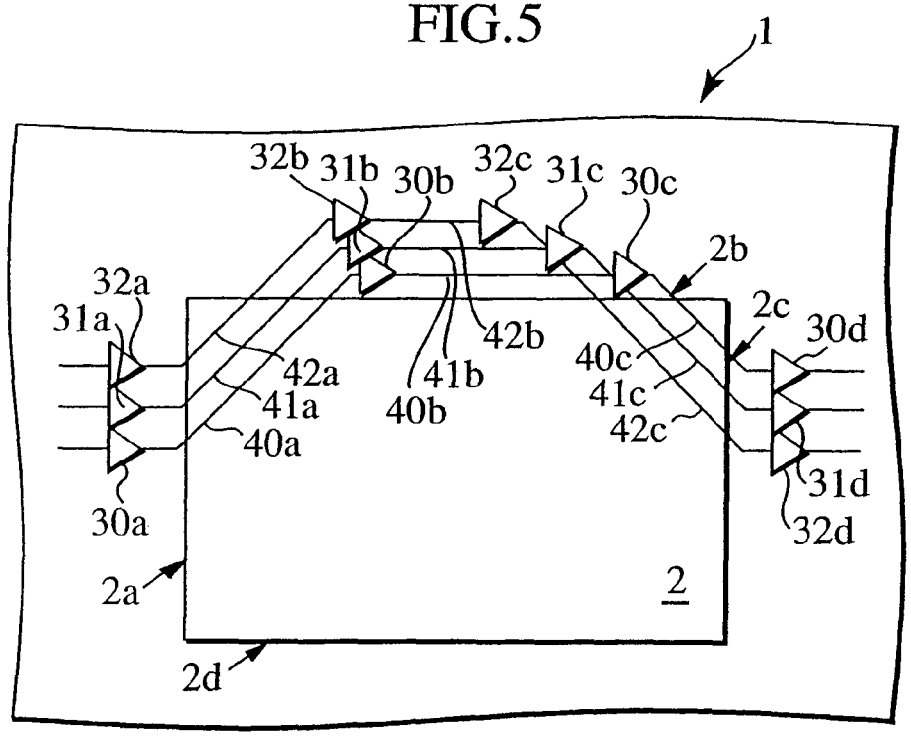
FIG. 5 is a schematic view showing a fourth basic structure of the semiconductor integrated circuit according to the first embodiment of the present invention.

The fourth basic structure of the semiconductor integrated circuit according to the first embodiment is for describing an example where the second and third basic structures are combined. As shown in FIG. 5, the semiconductor integrated circuit includes the function block 2 upon the substrate 1, the first buffering cells 30a to 32a, which are arranged in the vicinity of the first side 2a of the function block 2, the second buffering cells 30b to 32b, which are arranged in the vicinity of the second side 2b adjacent to the first side 2a, and the signal wirings 40a to 42a, which pass obliquely over the function block 2 relative to the first side 2a and the second side 2b, connecting the first buffering cells 30a to 32a and the second buffering cells 30b to 32b, respectively.

Similarly, the semiconductor integrated circuit includes the function block 2 upon the substrate 1, the third buffering cells 30c to 32c, which are arranged in the vicinity of the second side 2b of the function block 2, fourth buffering cells 30d to 32d, which are arranged in the vicinity of the third side 2c adjacent to the second side 2b, and signal wirings 40c to 42c, which pass obliquely over the function block 2 relative to the second side 2b and the third side 2c, connecting the third buffering cells 30c to 32c and the fourth buffering cells 30d to 32d, respectively.

The signal wirings 40a to 42a and 40c to 42c are bus signal wirings and are global signal wirings like the signal wirings 40a to 42a and 40b to 42b with the third basic structure.

The function block 2 with the fourth basic structure has either a large planar size or an oblong planar shape in the same way as the function block 2 with the aforementioned second basic structure.

In the semiconductor integrated circuit including this function block 2, as with the signal wiring 4b with the aforementioned second basic structure, the signal wirings 40b to 42b are arranged outside of the function block 2 substantially parallel along the second side 2b thereof. Furthermore, on the outside of the function block 2, the signal wirings 40b to 42b connect the buffering cells 30b to 32b and 30c to 32c arranged along the second side 2b apart from each other, respectively.

The same results as obtained with the first basic structure can be obtained with the fourth basic structure of the semiconductor integrated circuit according to the first embodiment configured in this manner.

A Concrete Layout of a Semiconductor Integrated Circuit

Next, a concrete layout structure of the semiconductor integrated circuit according to the first embodiment is described. In this case, the semiconductor integrated circuit is one that employs standard cell method.

Figure 6:
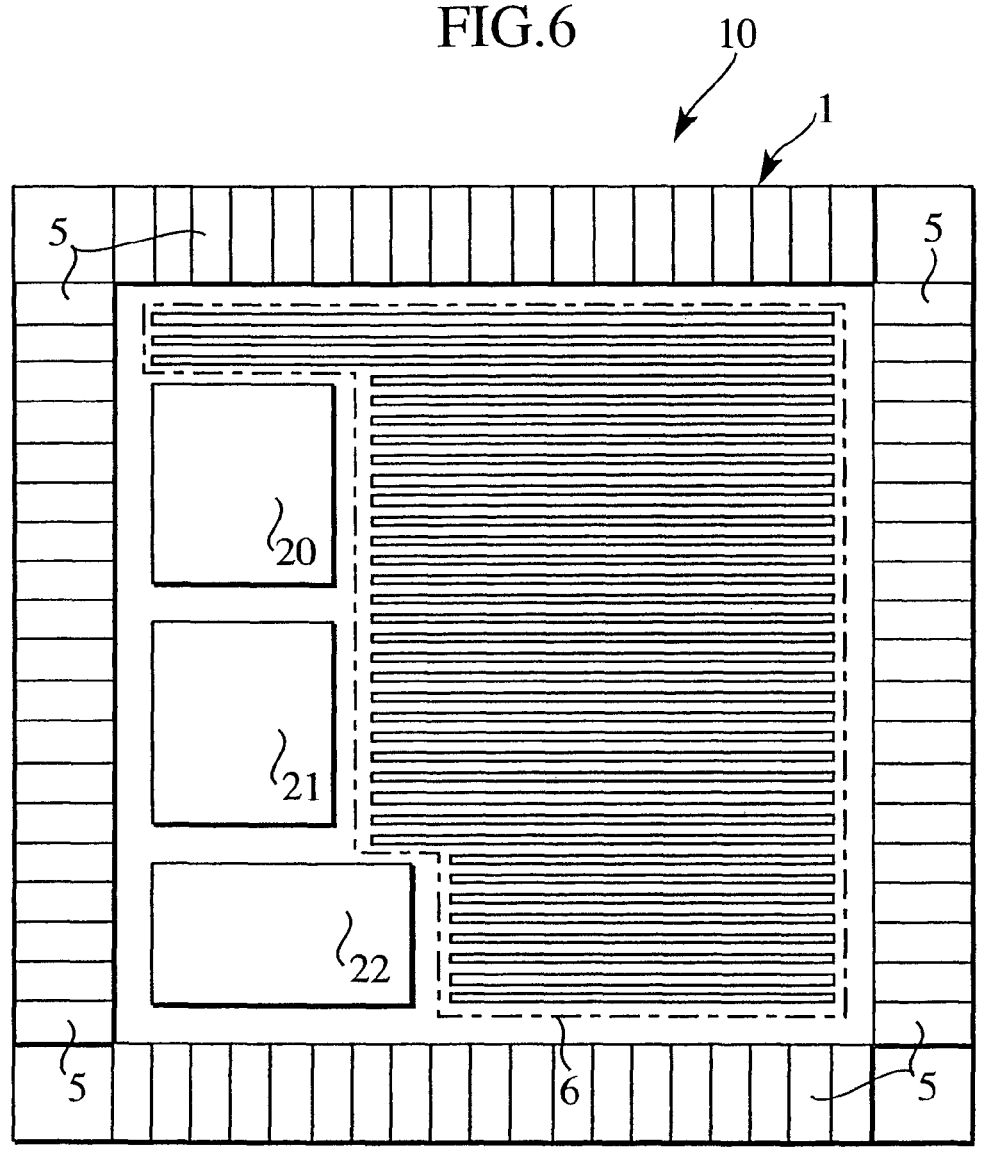
FIG. 6 is a plane view showing an example of a layout of a structure of the semiconductor integrated circuit according to the first embodiment of the present invention.

As shown in FIG. 6, a semiconductor integrated circuit 10 includes a substrate 1, a plurality of input/output buffering cells 5, which are aligned along each side of the surrounding areas upon the substrate 1, and function blocks 20 to 22 and random logic rows 6, which are arranged in the central area upon the substrate 1.

The input/output buffering cells 5 are interface circuits between the semiconductor integrated circuit 10 interior and the exterior thereof. The input/output buffering cells 5 comprise a plurality of semiconductor devices that can configure input interface circuits, output interface circuits, input/output interface circuits and the like (a layout structure thereof is not shown in the drawing.) Moreover, the input/output buffering cells 5 comprise semiconductor devices including at least transistors, resistors, and capacitors and the like that can configure input protection circuits and output protection circuits and the like. Furthermore, the input/output buffering cells 5 comprise external terminals (bonding pads) not shown in the drawing.

The function blocks 20 to 22 have a function equivalent to that of the function block 2 of the above-mentioned semiconductor integrated circuit described in the first basic structure, and correspond to mega cells or the like.

The random logic rows 6 are configured with a plurality of basic cells evenly aligned in the X direction. Each of these basic cells is arranged between wiring areas in the Y direction. Each basic cell includes a plurality of semiconductor devices that can configure logic circuits such as an inverter circuit or a NAND circuit by reconfiguring the intra-block wirings 4x and 4y.

First Basic Structure of a Buffering Cell

Next, with the first basic structure of the semiconductor integrated circuit, a concrete structure of the first through third buffering cells 3a to 3c inserted between the signal wirings 4a to 4c, which are global signal wirings, is described. It should be noted that since the structure of the buffering cells 30a, 31a, 32a and 3a in the second through fourth basic structures of the semiconductor integrated circuit are the same, descriptions thereof are omitted. Furthermore, in the description of the first through fourth basic structures of the buffering cell 3a, a generic reference numeral '3' is attached to the buffering cells to avoid complicated reference numerals and simplify description.

<Circuit Structure>

Figure 7A:
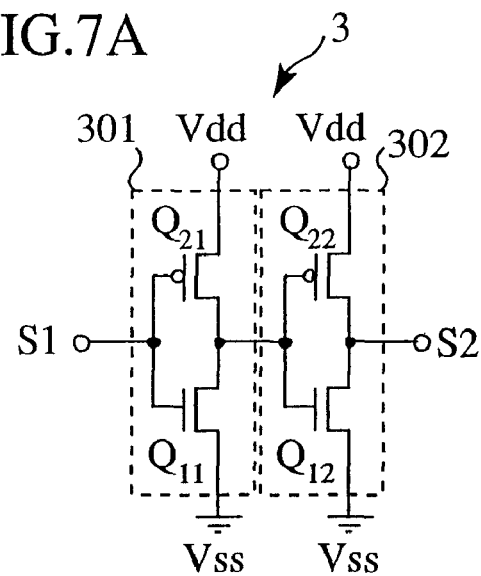
FIG. 7A is a circuit diagram of a first basic structure of a buffering cell of the semiconductor integrated circuit according to the first embodiment of the present invention.

The buffering cell 3 with the first basic structure, as shown in FIG. 7A, is configured by two-step structure inverter circuits 301 and 302, which are electrically connected in series between a signal input terminal S1 and a signal output terminal S2.

The inverter circuit 301 is a front circuit connected directly to the signal input terminal S1. This inverter circuit 301 is configured with an n-channel insulated gate field-effect transistor (hereafter, simply referred to as IGFET) Q11 and a p-channel IGFET Q21, which form a complementary IGFET structure. Here, the IGFET denotes at least a metal oxide semiconductor field-effect transistor (MOSFET) and a metal insulator semiconductor field-effect transistor (MISFET). The n-channel IGFET Q11 has a gate electrode connected to the signal input terminal S1, the source electrode connected to a reference power supply $V_{ss}$, and the drain electrode connected to the drain electrode of the p-channel IGFET Q21. The reference power supply $V_{ss}$ is a ground potential, for example 0V, for the circuit. The p-channel IGFET Q21 has a gate electrode connected to the signal input terminal S1, and the source electrode connected to an operating power supply $V_{dd}$. The operating power supply $V_{dd}$ is an operating voltage, for example 1.7V to 3.3V, for the circuit.

The inverter circuit 302 is a subsequent circuit (a following circuit) connected directly to the signal input terminal S2. This inverter circuit 302 is a complementary IGFET including an n-channel IGFET Q12 and a p-channel IGFET Q22 as with the inverter circuit 301. The n-channel IGFET Q12 has a gate electrode connected to the drain electrode of the n-channel IGFET Q11 the p-channel IGFET Q21, the source electrode connected to a reference power supply $V_{ss}$, and the drain electrode connected to the drain electrode of the p-channel IGFET Q22. The p-channel IGFET Q22 has a gate electrode connected to the drain electrode of the n-channel IGFET Q11 and the p-channel IGFET Q21, and the source electrode connected to an operating power supply $V_{dd}$. The drain electrodes of the n-channel IGFET Q12 and the p-channel IGFET Q22 are connected to the signal output terminal S2.

<Device Structure>

The aforementioned buffering cells 3 are configured with, for example, the basic cells of the random logic rows 6 shown in FIG. 6. Herein, only the inverter circuit 301 to configure the buffering cell 3 is described, and since the device structure of the inverter circuit 302 is the same as that of the inverter circuit 301, description thereof is omitted.

Figure 7B:
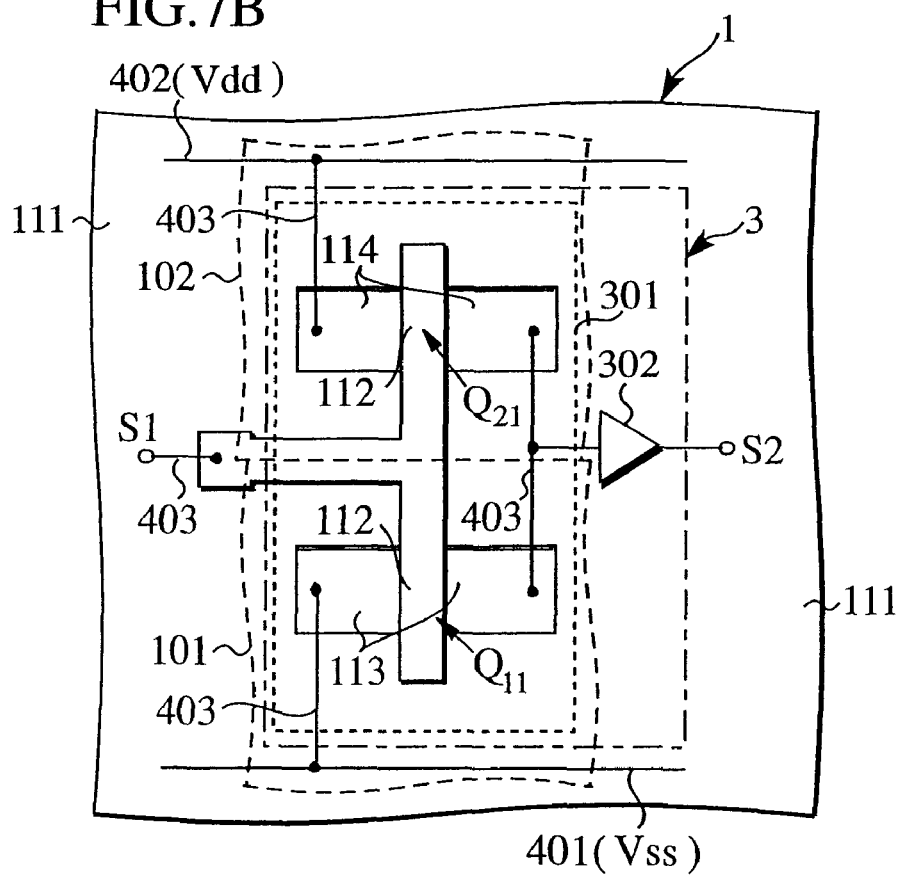
FIG. 7B is a plane view showing the first basic structure of the buffering cell of the semiconductor integrated circuit according to the first embodiment of the present invention.

As shown in FIG. 7B, the n-channel IGFET Q11 of the inverter circuit 301 is arranged in a p-well region 101 formed in the substrate 1 surface, which is enclosed by an isolation insulating film 111. In other words, the n-channel IGFET Q11 includes the p-well region 101, which is used as an active region, a gate insulator (not shown in the drawing) arranged on this p-well region 101, a gate electrode 112 arranged on the gate insulator, and a pair of n-type semiconductor regions 113, which are used as the source and drain regions arranged on both sides along the length of the gate electrode 112.

A single layer film made from either a silicon oxide layer, a silicon nitride film or an oxynitride film, or a compound film thereof may be practically used as the gate insulator. A single layer film made from either a silicon polycrystalwiring film, a refractory metal film, or a refractory metal silicide film, or a compound film layered with a refractory metal film, or a refractory metal silicide film upon a silicon polycrystalwiring film may be practically used as the gate electrode 112. A lightly doped drain (LDD) structure may be practically used for the n-type semiconductor region 113.

The p-channel IGFET Q21 is arranged in an n-well region 102 formed in the substrate 1 surface, which is enclosed by the isolation insulating film 111. In other words, the n-channel IGFET Q21 includes the n-well region 102, which is used as an active region, a gate insulator not shown in the drawing arranged on this n-well region 102, a gate electrode 112 arranged on the gate insulator, and a pair of p-type semiconductor regions 114, which are used as the source and drain regions arranged on both sides along the length of the gate electrode 112. The practical materials for the gate insulator and the gate electrode and the practical structure of the p-type semiconductor region 114 are the same as with the n-channel IGGET Q11.

In the random logic rows 6, an intra-cell power supply wiring ($V_{ss}$) 401 and an intra-cell operating power supply wiring ($V_{dd}$) 402 are arranged extending in the X direction. The intra-cell power supply wiring ($V_{ss}$) 401 is connected to the n-type semiconductor region (source region) 113 of the n-channel IGFET Q11 through an intra-cell wiring 403. The intra-cell operating power supply wiring 402 is connected to the p-type semiconductor region (source region) 114 of the p-channel IGFET Q21 through an intra-cell wiring 403. Furthermore, the gate electrodes 112 of the n-channel IGFET Q11 and the p-channel IGFET Q21 are connected, respectively, to the signal input terminal S1 through an intra-cell wiring 403, and the drain region is connected to the subsequent circuit 302. The intra-cell power supply wiring 401, the intra-cell operating power supply wiring 402 and the intra-cell wirings 403 are arranged in the first wiring layer and are made of, for example, an aluminum alloy (Al—Si, Al—Cu, Al—Cu—Si or the like).

Second Basic Structure of a Buffering Cell

A buffering cell 3 with a second basic structure is one with double the driving capability of the buffering cell 3 with the first basic structure.

<Circuit Structure>

Figure 8A:
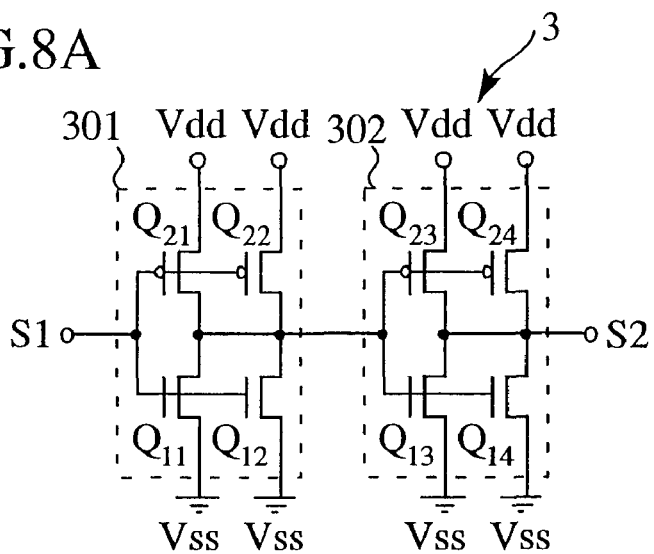
FIG. 8A is a circuit diagram of a second basic structure of a buffering cell of the semiconductor integrated circuit according to the first embodiment of the present invention.

The buffering cell 3 with the second basic structure, as shown in FIG. 8A, is configured by two-step structure inverter circuits 301 and 302, which are electrically connected in series between the signal input terminal Si and the signal output terminal S2.

The inverter circuit 301 is a front circuit connected directly to the signal input terminal S1. This inverter circuit 301 has a two-step structure where the drain electrodes of the n-channel IGFET Q11 and the p-channel IGFET Q21 and the drain electrodes of the n-channel IGFET Q12 and the p-channel IGFET Q22 are electrically connected, respectively. Each of the n-channel IGFET Q11 and Q12 has a gate electrode connected to the signal input terminal S1, the source electrode connected to a reference power supply $V_{ss}$, and the drain electrode connected to the drain electrode of the p-channel IGFET Q21 and Q22. Each of the p-channel IGFET Q21 and Q22 has a gate electrode connected to the signal input terminal S1, and the source electrode connected to an operating power supply $V_{dd}$.

The inverter circuit 302 is a subsequent circuit connected directly to the signal output terminal S2. This inverter circuit 302, similar to the inverter circuit 301, has a two-step structure where the drain electrodes of an n-channel IGFET Q13 and a p-channel IGFET Q23 and the drain electrodes of an n-channel IGFET Q14 and a p-channel IGFET Q24 are electrically connected, respectively. Each of the n-channel IGFET Q13 and Q14 has a gate electrode connected to the inverter circuit 301 (the drain electrodes of IGFET Q11, Q12, Q21, and Q22), a source electrode connected to a reference power supply $V_{ss}$, and a drain electrode connected to the drain electrodes of the p-channel IGFET Q23 and Q24. Each of the p-channel IGFET Q23 and Q24 has a gate electrode connected to the signal input terminal S1, and a source electrode connected to an operating power supply $V_{dd}$. The drain electrodes of the n-channel IGFET Q13 and Q14 and the p-channel IGFET Q23 and Q24 are connected to the signal output terminal S2.

<Device Structure>

Herein, as with the buffering cell 3 having the first basic structure, only the inverter circuit 301 of the buffering cell 3 is described, and description of the inverter circuit 302 is omitted.

Figure 8B:
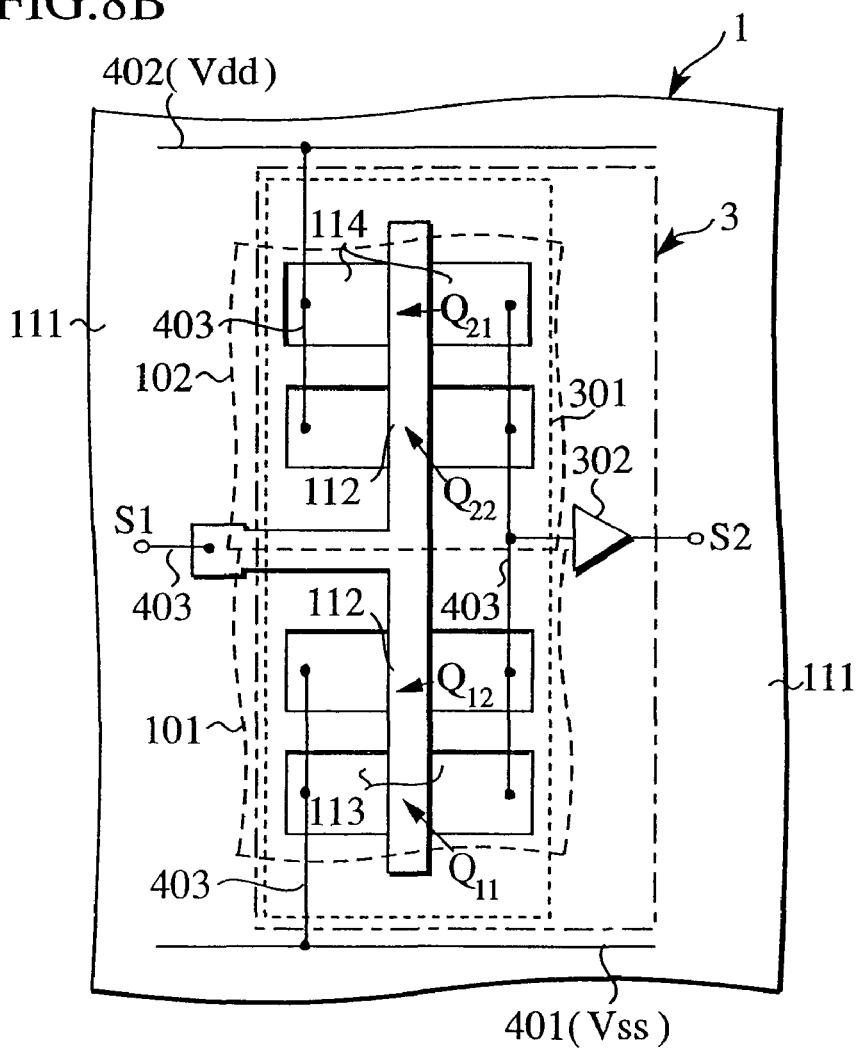
FIG. 8B is a plane view showing the second basic structure of the buffering cell of the semiconductor integrated circuit according to the first embodiment of the present invention.

The n-channel IGFET Q11 and Q12 of the inverter circuit 301, as shown in FIG. 8B, are arranged with their gate width directions in accordance, facing the Y direction adjacent to each other. The n-channel IGFET Q11 and Q12 are both arranged in the p-well region 101 formed in the substrate 1 surface, which is enclosed by the isolation insulating film 111. In other words, each of the n-channel IGFET Q11 and Q12 includes the p-well region 101, which is used as an active region, a gate insulator (not shown in the drawing) arranged on this p-well region 101, a gate electrode 112 arranged on the gate insulator, and a pair of n-type semiconductor regions 113, which are used as the source and drain regions arranged on both sides along the length of the gate electrode 112.

The p-channel IGFET Q21 and Q22 are arranged with their gate width directions in accordance, facing the Y direction adjacent to each other. The p-channel IGFET Q21 and Q22 are both arranged in the n-well region 102 formed in the substrate 1 surface, which is enclosed by the isolation insulating film 111. In other words, each of the p-channel IGFET Q21 and Q22 includes the n-well region 102, which is used as an active region, a gate insulator (not shown in the drawing) arranged on this n-well region 102, a gate electrode 112 arranged on the gate insulator, and a pair of n-type semiconductor regions 114, which are used as the source and drain regions arranged on both sides along the length of the gate electrode 112.

It should be noted that the practical materials for the gate insulator and gate electrodes of the n-channel IGFET Q11 and Q12 and the p-channel IGFET Q21 and Q22, as well as the practical structure of the n-type semiconductor region 113 and the p-type semiconductor region 114 are the same as for the n-channel IGFET Q11 and the p-channel IGFET Q21 with the first basic structure. Furthermore, the intra-cell power supply wiring 401, the intra-cell operating power supply wiring 402 and the intra-cell wirings 403 are similar to the intra-cell reference power supply wiring 401 with the first basic structure, only differing in their wire connection patterns.

Third Basic Structure of a Buffering Cell

A buffering cell 3 with a third basic structure is one with triple the driving capability of the buffering cell 3 with the first basic structure.

<Circuit Structure>

Figure 9A:
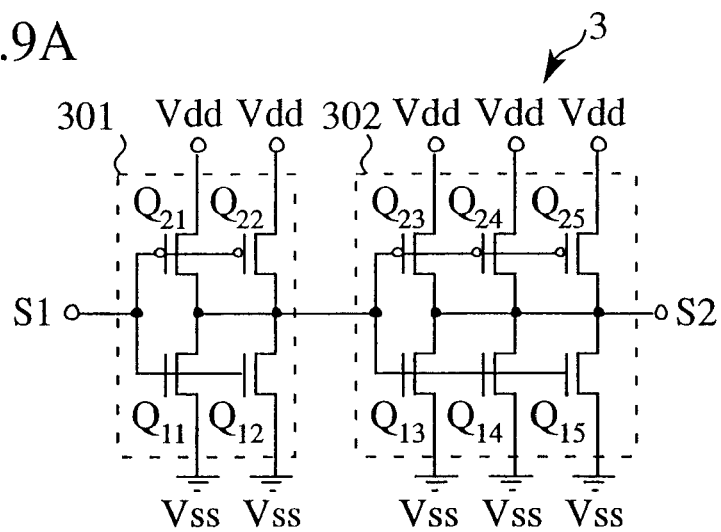
FIG. 9A is a circuit diagram of a third basic structure of a buffering cell of the semiconductor integrated circuit according to the first embodiment of the present invention.

The buffering cell 3 with the third basic structure, as shown in FIG. 9A, is configured by the two-step structure inverter circuits 301 and 302, which are electrically connected in series between the signal input terminal S1 and the signal output terminal S2.

The inverter circuit 301 is a front circuit connected directly to the signal input terminal S1, and basically has the same structure as the inverter circuit 301 of the buffering cell 3 with the second basic structure. Namely, the inverter circuit 301 has a two-step structure where the drain electrodes of the n-channel IGFET Q11 and the p-channel IGFET Q21 and the drain electrodes of the n-channel IGFET Q12 and the p-channel IGFET Q22 are electrically connected, respectively. Each of the n-channel IGFET Q11 and Q12 has a gate electrode connected to the signal input terminal S1, a source electrode connected to a reference power supply $V_{ss}$, and a drain electrode connected to the drain electrode of the p-channel IGFET Q21 and Q22. Each of the p-channel IGFET Q21 and Q22 has a gate electrode connected to the signal input terminal S1, and a source electrode connected to an operating power supply $V_{dd}$.

The inverter circuit 302 is a subsequent circuit connected directly to the signal output terminal S2. This inverter circuit 302 has a three-step structure where the drain electrodes of the n-channel IGFET Q13 and the p-channel IGFET Q23, the drain electrodes of the n-channel IGFET Q14 and the p-channel IGFET Q24, and the drain electrodes of an n-channel IGFET Q15 and a p-channel IGFET Q25 are electrically connected, respectively. Each of the n-channel IGFET Q13, Q14 and Q15 has a gate electrode connected to the inverter circuit 301 (the drain electrode of IGFET Q11, Q12, Q21, and Q22), a source electrode connected to a reference power supply $V_{ss}$, and a drain electrode connected to the drain electrode of the p-channel IGFET Q23 and Q24. Each of the p-channel IGFET Q23, Q24 and Q25 has a gate electrode connected to the signal input terminal S1, and a source electrode connected to an operating power supply $V_{dd}$. The drain electrodes of the n-channel IGFET Q13 to Q15 and the p-channel IGFET Q23 to Q25 are connected to the signal output terminal S2.

<Device Structure>

The basic structure of inverter circuit 301 of the buffering cell 3 is the same as that of the inverter circuits 301 and 302 of the buffering cell 3 with the second basic structure, and thus only the inverter circuit 302 of the buffering cell 3 is described here, and description of the inverter circuit 301 is omitted.

Figure 9B:
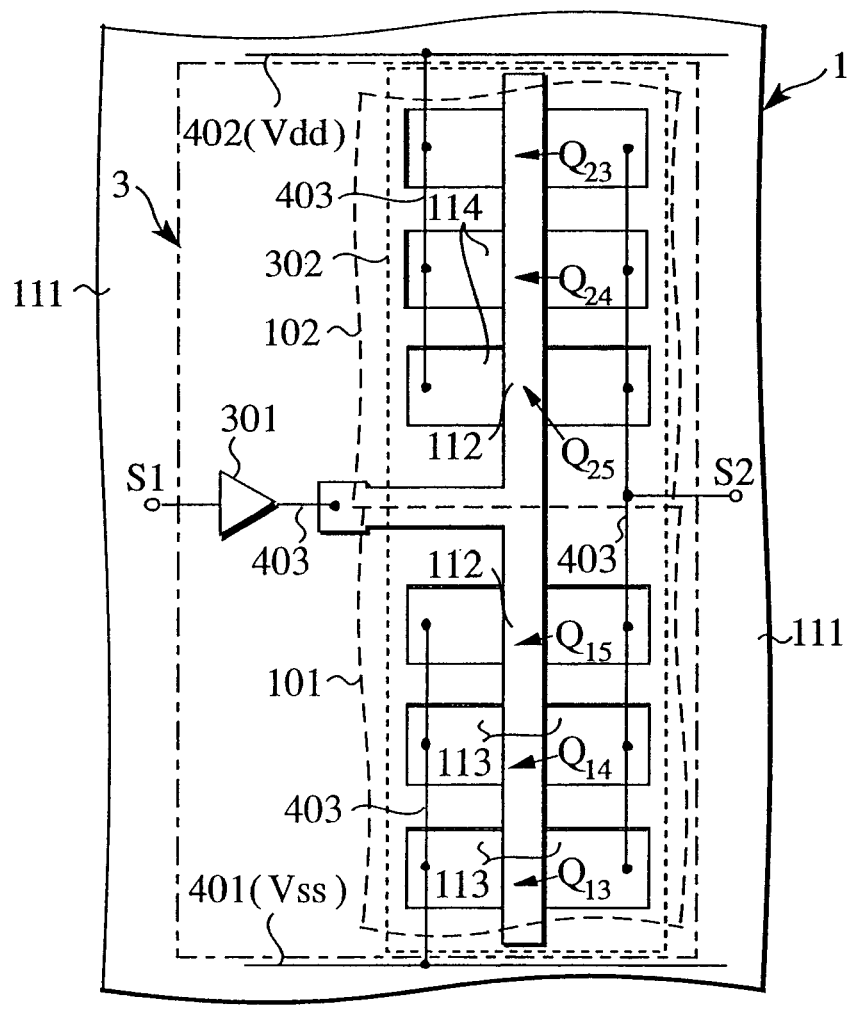
FIG. 9B is a plane view showing the third basic structure of the buffering cell of the semiconductor integrated circuit according to the first embodiment of the present invention.

The n-channel IGFET Q13, Q14 and Q15 of the inverter circuit 302, as shown in FIG. 9B, are arranged with their gate width directions in accordance, facing the Y direction adjacent to each other. The n-channel IGFET Q13, Q14 and Q15 are all arranged in the p-well region 101 formed in the substrate 1 surface, which is enclosed by the isolation insulating film 111. In other words, the n-channel IGFET Q13, Q14 and Q15 include the p-well region 101, which is used as an active region, a gate insulator not shown in the drawing arranged on this p-well region 1, a gate electrode 112 arranged on the gate insulator, and a pair of n-type semiconductor regions 113, which are used as the source and drain regions arranged on both sides along the length of the gate electrode 112.

The p-channel IGFET Q23, Q24 and Q25 are arranged with their gate width directions in accordance, and the n-channel IGFET Q13, Q14 and Q15 are arranged with their gate width directions in accordance, facing the Y direction adjacent to each other, respectively. The p-channel IGFET Q23, Q24 and Q25 are all arranged in the n-well region 102 formed in the substrate 1 surface, which is enclosed by the isolation insulating film 111. In other words, the p-channel IGFET Q23, Q24 and Q25 include the n-well region 102, which is used as an active region, a gate insulator not shown in the drawing arranged on this p-well region 1, a gate electrode 112 arranged on the gate insulator, and a pair of p-type semiconductor regions 113, which are used as the source and drain regions arranged on both sides along the length of the gate electrode 112.

It should be noted that the practical materials for the gate insulator and gate electrodes of the n-channel IGFET Q13, Q14 and Q15 and the p-channel IGFET Q23, Q24 and Q25, as well as the practical structure of the n-type semiconductor region 113 and the p-type semiconductor region 114 are the same as with the n-channel IGFET Q11 and the p-channel IGFET Q21 having the first basic structure. Furthermore, the intra-cell power supply wiring ($V_{ss}$) 401, the intra-cell operating power supply wiring ($V_{dd}$) 402 and the intra-cell wirings 403 are similar to intra-cell reference power supply wiring 401 with the first basic structure only differing in their wire connection patterns.

Fourth Basic Structure of a Buffering Cell

A buffering cell 3 with a fourth basic structure has triple the driving capabilities of both the inverter circuits 301 and 302 in the buffering cell 3 with the first basic structure.
<Circuit Structure>

Figure 10:
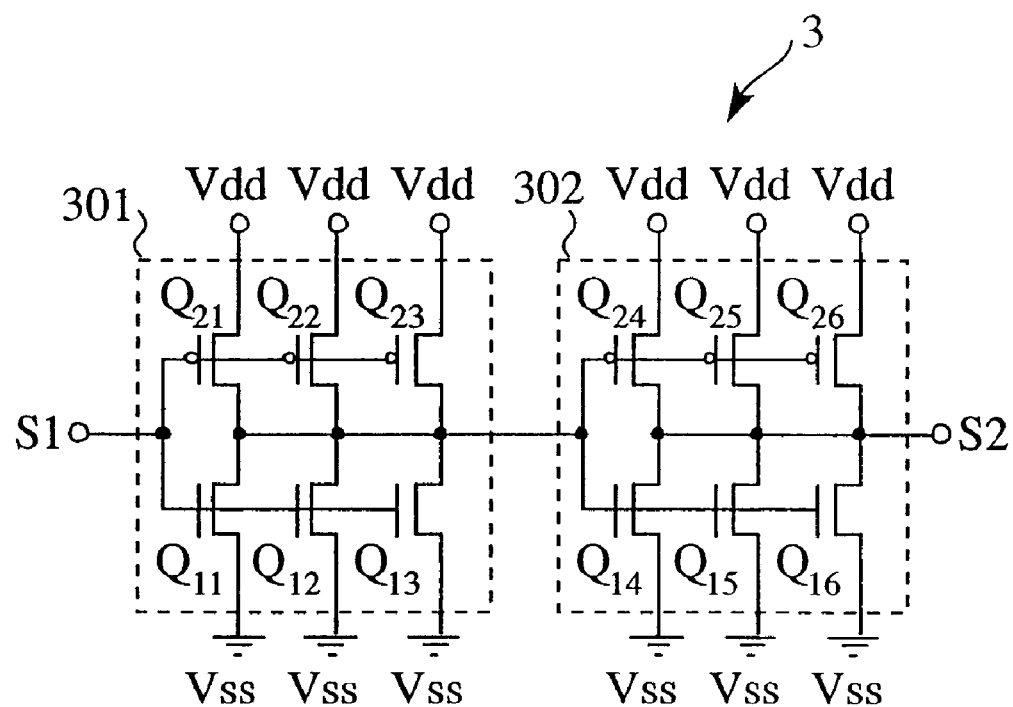
FIG. 10 is a circuit diagram of a fourth basic structure of a buffering cell of the semiconductor integrated circuit according to the first embodiment of the present invention.

The buffering cell 3 with the fourth basic structure, as shown in FIG. 10, is configured by the two-step structure inverter circuits 301 and 302, which are electrically connected in series between the signal input terminal S1 and the signal output terminal S2.

The inverter circuit 301 is a front circuit connected directly to the signal input terminal S1, and basically has the same structure as the inverter circuit 302 of the buffering cell 3 with the third basic structure. Namely, the inverter circuit 301 has a three-step structure where the drain electrodes of the n-channel IGFET Q11 and the p-channel IGFET Q21, the drain electrodes of the n-channel IGFET Q12 and the p-channel IGFET Q22, and the drain electrodes of an n-channel IGFET Q13 and a p-channel IGFET Q23 are electrically connected, respectively. Each of the n-channel IGFET Q11, Q12 and Q13 has a gate electrode connected to the signal input terminal S1, a source electrode connected to a reference power supply $V_{ss}$, and a drain electrode connected to the drain electrodes of the p-channel IGFET Q21, Q22 and Q23. Each of the p-channel IGFET Q21, Q22 and Q23 has a gate electrode connected to the signal input terminal S1, and a source electrode connected to an operating power supply $V_{dd}$.

The inverter circuit 302 is a subsequent circuit connected directly to the signal input terminal S2, and basically has the same structure as the inverter circuit 302 of the buffering cell 3 with the third basic structure. The inverter circuit 302 has a three-step structure where the drain electrodes of the n-channel IGFET Q14 and the p-channel IGFET Q24, the drain electrodes of the n-channel IGFET Q15 and the p-channel IGFET Q25, and the drain electrodes of an n-channel IGFET Q16 and a p-channel IGFET Q26 are electrically connected, respectively. Each of the n-channel IGFET Q14, Q15 and Q16 has a gate electrode connected to the inverter circuit 301 (the drain electrode of IGFET Q11, Q12, Q13, Q21, Q22 and Q23), a source electrode connected to a reference power supply $V_{ss}$, and a drain electrode connected to the drain electrodes of the p-channel IGFET Q24, Q25 and Q26. Each of the p-channel IGFET Q24, Q25 and Q26 has a gate electrode connected to the signal input terminal S1, and a source electrode connected to an operating power supply $V_{dd}$. The drain electrodes of the n-channel IGFET Q14 to Q16 and the p-channel IGFET Q24 to Q26 are connected to the signal output terminal S2.
<Device Structure>

The basic structure of inverter circuits 301 and 302 of the buffering cell 3 is the same as that of the inverter circuit 302 of the buffering cell 3 with the third basic structure, and thus description of the device structure thereof is omitted.

Another Basic Structure of a Buffering Cell

As mentioned before, the structure of the buffering cell 3 can be appropriately modified. For example, when the global signal wiring is relatively long and the wiring load is large, at least the inverter circuit 302 of the buffering cell 3 can be configured by a four or more step structure. Furthermore, in the case of enhancing the driving capability, at least the IGFET Q gate width of the final output phase of the inverter circuit 302 may be longer than the other IGFET Q gate width.

First Exemplary Layout of Signal Lines

Figure 11:
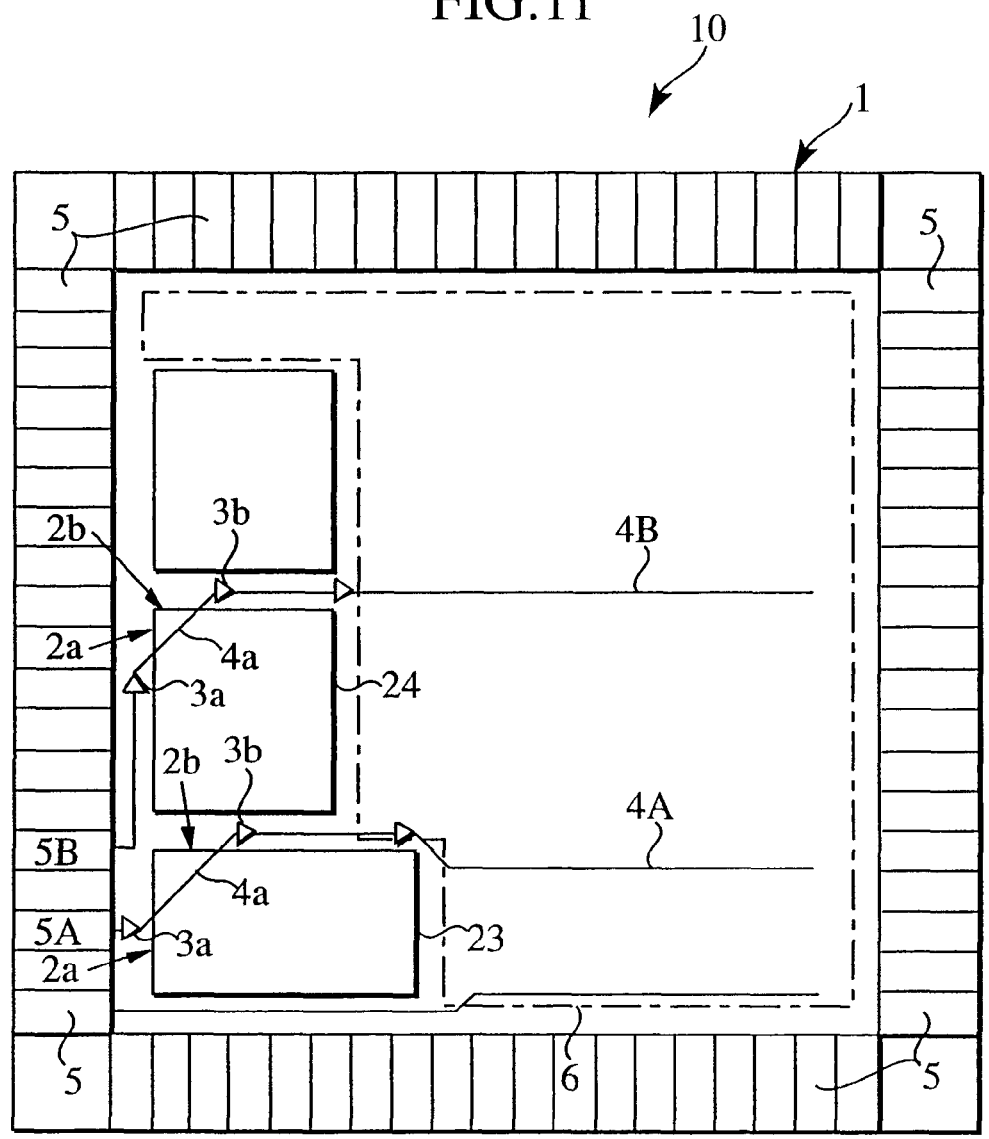
FIG. 11 is a plane view showing a first exemplary layout of a signal wiring of the semiconductor integrated circuit according to the first embodiment of the present invention.

Next, a first exemplary layout of global signal wirings in a semiconductor integrated circuit 10 is shown in FIG. 11. Here, for simplification of description, an example of two global signal wirings 4A and 4B being conveniently arranged is described.

The function blocks 23 and 24 are arranged upon the substrate 1 of the semiconductor integrated circuit 10. In FIG. 11, the global signal wiring 4A, which extends from an input/output buffering cell 5A arranged on the left side of the substrate 1, passes obliquely over the function block 23, and extends across an extensive range until reaching close to the right side of the substrate 1. A part of a signal wiring 4a of the global signal wiring 4A passing over the function block 23 is arranged obliquely relative to the first side 2a and the second side 2b of the function block 23. A buffering cell 3a is arranged in the vicinity of or adjacent to the first side 2a of the function block 23, and a buffering cell 3b is arranged in the vicinity of or adjacent to the second side 2b. One end of the signal wiring 4a is electrically connected to the buffering cell 3a, and the other end is electrically connected to the buffering cell 3b.

Similarly, the global signal wiring 4B, which extends from an input/output buffering cell 5B arranged on the left side of the substrate 1, passes over the function block 24 at an angle, and extends across an extensive range until reaching close to the right side of the substrate 1. A part of the signal wiring 4a of the global signal wiring 4B passing over the function block 24 is arranged obliquely relative to the first side 2a and the second side 2b of the function block 24. A buffering cell 3a is arranged in the vicinity of or adjacent to the first side 2a of the function block 24, and a buffering cell 3b is arranged in the vicinity of or adjacent to the second side 2b. One end of the signal wiring 4a is electrically connected to the buffering cell 3a, and the other end is electrically connected to the buffering cell 3b.

With the semiconductor integrated circuit 10, which includes such a first layout of global signal wiring, the wiring length of the global signal wirings 4A and 4B can be shortened, and the wiring capacitance can be reduced due to the signal wiring 4a passing over the function blocks 23 and 24. The number of necessary buffering cells can be reduced in the global signal wiring 4A by shortening the wiring length of global signal wiring 4A. Similarly, the number of necessary buffering cells can be reduced in the global signal wiring 4B by shortening the wiring length of global signal wiring 4B. In addition, structure of buffering cell 3 can be optimized depending on wiring capacitance, and electricity composed and an area of a buffering cell can be reduced. Moreover, the driving capability of the buffering cell 3a may be relatively increased as the wiring capacitance reduces. Accordingly, since the frequency of the global signal wiring 4A bypassing the function block 23 may be reduced, the frequency of the global signal wiring 4B bypassing the function block 24 may be reduced, and signal delay may be prevented, the semiconductor integrated circuit 10 with excellent operating capability that is optimum for high integration can be provided.

Second Exemplary Layout of Signal Wirings

Figure 12:
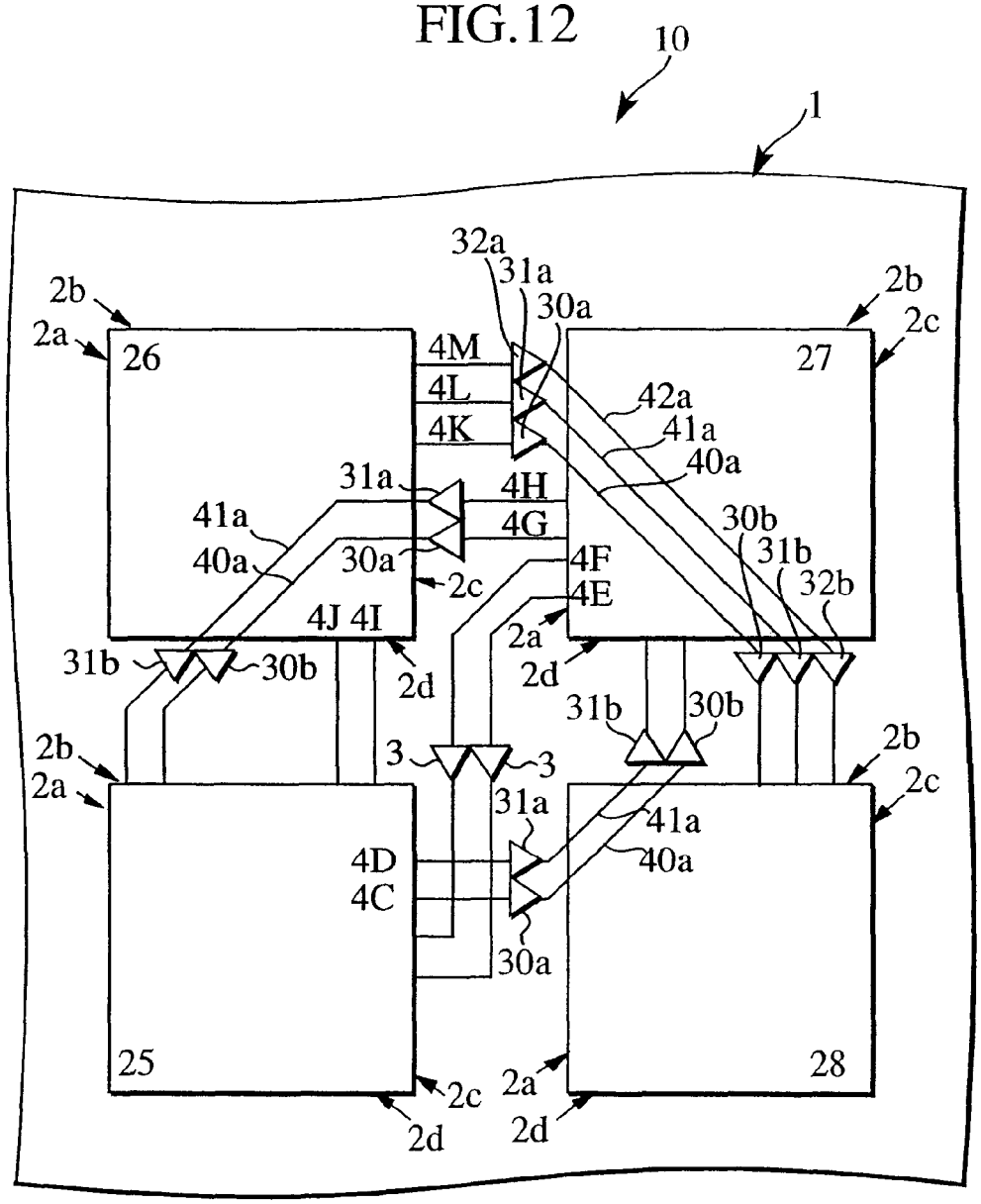
FIG. 12 is a plane view showing a second exemplary layout of the signal wiring of the semiconductor integrated circuit according to the first embodiment of the present invention.

Next, a second exemplary layout of global signal wiring in the semiconductor integrated circuit 10 is shown in FIG. 12. The second layout is one for describing an example that moderates or disperses signal wiring hotspots between function blocks. In the following description, a 'hotspot' is an area where signal wiring is crowded. It should be noted that the second layout is not limited to only global signal wiring, and may be applied to the layout for signal wiring and power supply wiring arranged between function blocks.

In the semiconductor integrated circuit 10, a function block 25 is arranged at the lower left of the substrate 1, a function block 26 is arranged at the upper left, a function block 27 is arranged at the upper right, and a function block 28 is arranged at the lower right. It should be noted that the case of four function blocks 25 to 28 being conveniently arranged is described; however, the number of function blocks to be arranged is not limited thereto. The function block 25 outputs a predetermined signal to the function block 27, which is arranged at the upper right as viewed from the function block 25, through signal wirings 4C and 4D. The signal wiring 4C extends from the function block 25 to the right side (X direction), passes obliquely over the function block 28, which is arranged on the right side as viewed from the function block 25, and then extends to the upper side (Y direction), connecting to the function block 27. A buffering cell 30a is arranged in the vicinity of or adjacent to the first side 2a of the function block 28, and a buffering cell 30b is arranged in the vicinity of or adjacent to the second side 2b. One end of the signal wiring 40a, which is a part of the signal wiring 4C and passes over the function block 28, is connected to the buffering cell 30a, and the other end is connected to the buffering cell 30b. Similarly, the signal wiring 4D extends from the function block 25 to the right side, passes obliquely over the function block 28, and extends to the upper side, connecting to the function block 27. A buffering cell 31a is arranged in the vicinity of or adjacent to the first side 2a of the function block 28, and a buffering cell 31b is arranged in the vicinity of or adjacent to the second side 2b. One end of the signal wiring 41a, which is a part of the signal wiring 4D and passes over the function block 28, is connected to the buffering cell 31a, and the other end is connected to the buffering cell 31b.

Furthermore, the function block 27 outputs a predetermined signal to the function block 25 through signal wirings 4E, 4F, 4G and 4H. The signal wirings 4E and 4F pass between the four function blocks 25 to 28, namely hotspots that easily become congested with signal wiring.

The signal wiring 4G extends from the function block 27 to the left side (X direction), passes obliquely over the function block 26, which is arranged on the left side as viewed from the function block 27, and then extends to the lower side (Y direction), connecting to the function block 25. A buffering cell 30a is arranged in the vicinity of the third side 2c of the function block 26, and a buffering cell 30b is arranged in the vicinity of the fourth side 2d. One end of the signal wiring 40a, which is a part of the signal wiring 4G and which passes over the function block 26, is connected to the buffering cell 30a, and the other end is connected to the buffering cell 30b. Similarly, the signal wiring 4H extends from the function block 27 to the left side, passes obliquely over the function block 26, and then extends to the lower side, connecting to the function block 25. A buffering cell 31a is arranged in the vicinity of the third side 2c of the function block 28, and a buffering cell 31b is arranged in the vicinity of the fourth side 2d. The signal wiring 41a, which is a part of the signal wiring 4H and passes over the function block 26, is connected to one end of the buffering cell 31a, and the other end is connected to the buffering cell 31b.

The function block 25 and the function block 26, which is arranged on the upper side as viewed from the function block 25, are directly connected through signal wirings 4I and 4J.

Here, when the wiring lengths of the signal wirings 4I and 4J are shorter than those of the signal wirings 4E and 4F, and the driving capability of the final output phase circuit of the function blocks 25 and 26 is sufficient, a buffering cell 3 need not be arranged in between the signal wirings 4I and 4J.

Moreover, the function block 26 outputs a predetermined signal to the function block 28, which is arranged at the lower right as viewed from the function block 26, through signal wirings 4K, 4L and 4M. The signal wiring 4K extends from the function block 26 to the right side (X direction), passes obliquely over the function block 27, which is arranged on the right side as viewed from the function block 26, and then extends to the lower side (Y direction), connecting to the function block 28. A buffering cell 30a is arranged in the vicinity of the first side 2a of the function block 27, and a buffering cell 30b is arranged in the vicinity of the fourth side 2d. One end of the signal wiring 40a, which is a part of the signal wiring 4K and passes over the function block 27, is connected to the buffering cell 30a, and the other end is connected to the buffering cell 30b. Similarly, the signal wiring 4L extends from the function block 26 to the right side, passes obliquely over the function block 27, and then extends to the lower side, connecting to the function block 28. A buffering cell 31a is arranged in the vicinity of the first side 2a of the function block 27, and a buffering cell 31b is arranged in the vicinity of the fourth side 2d. One end of the signal wiring 41a, which is a part of the signal wiring 4L and passes over the function block 27, is connected to the buffering cell 31a, and the other end is connected to the buffering cell 31b. The signal wiring 4M extends from the function block 26 to the right side, passes obliquely over the function block 27, and then extends to the lower side, connecting to the function block 28. A buffering cell 32a is arranged in the vicinity of the first side 2a of the function block 27, and a buffering cell 32b is arranged in the vicinity of the fourth side 2d. One end of the signal wiring 42a, which is a part of the signal wiring 4M and passes over the function block 27, is connected to the buffering cell 32a, and the other end is connected to the buffering cell 32b.

With the semiconductor integrated circuit 10 according to the first embodiment configured in this manner, the signal wirings 40a and 41a, which are part of the signal wirings 4C and 4D, respectively, pass obliquely over the function block 28, the signal wirings 40a and 41a, which are part of the signal wirings 4G and 4H, respectively, pass obliquely over the function block 26, and the signal wirings 40a, 41a and 42a, which are part of the signal wirings 4K, 4L and 4M, respectively, pass obliquely over the function block 27, allowing reduction or dispersion of signal wiring hotspots between function blocks.

Moreover, with the semiconductor integrated circuit 10, reducing bypassing signal wirings, which are routed around the perimeter of the function blocks 25 to 28, while dispersing hotspots is possible, thereby allowing control of signal transmission delay and implementation of high-speed circuit operation. In addition, buffering cell numerical reduction is possible by reducing the length of the bypassing signal wiring. Electricity consumption and an area of a buffering cell can be reduced because a structure of a buffering cell can be optimized according to the decrease in wiring capacitance.

Furthermore, with the semiconductor integrated circuit 10, arrangement regions for the signal wirings may be utilized effectively due to the dispersion of the hotspots, thereby improving integration.

Third Exemplary Layout of Signal Lines

Figure 13:
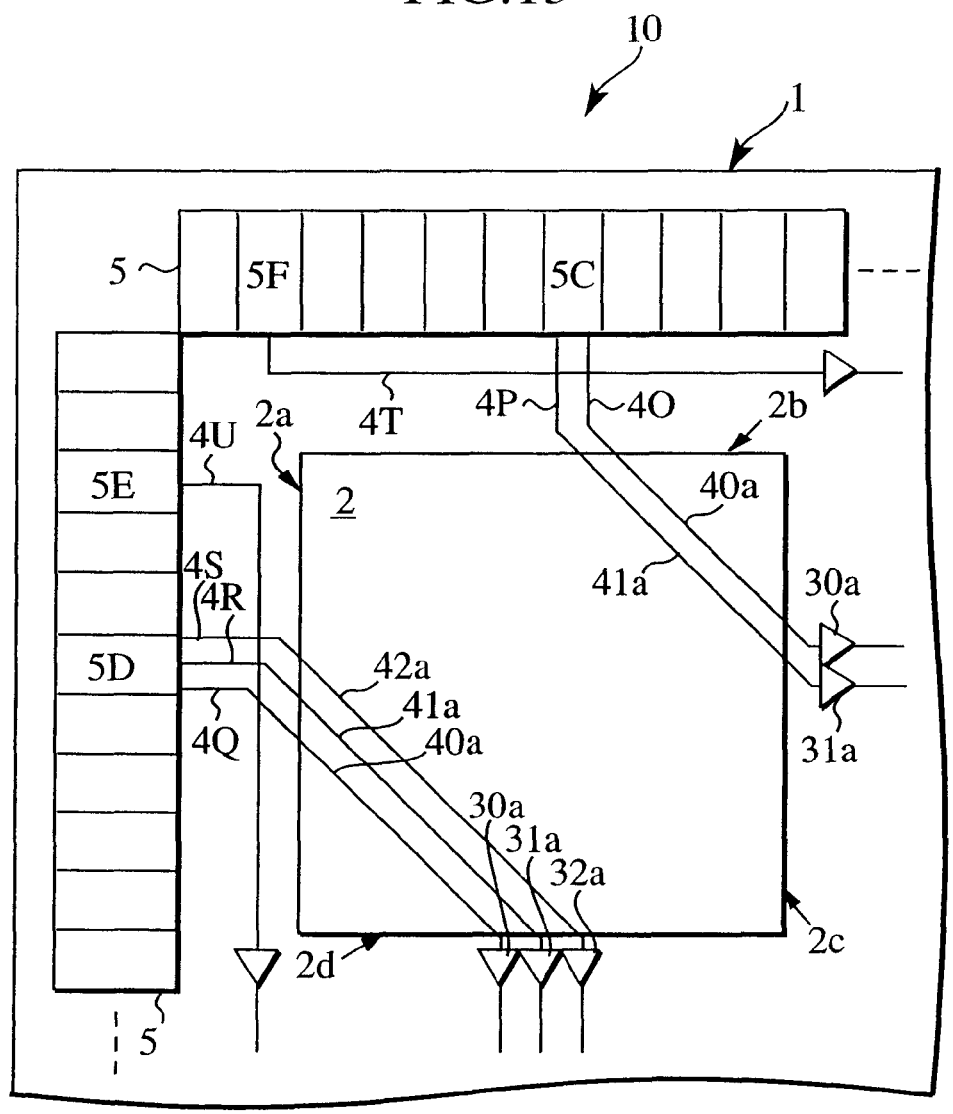
FIG. 13 is a plane view showing a third exemplary layout of the signal wiring of the semiconductor integrated circuit according to the first embodiment of the present invention.

Next, a third exemplary layout of global signal wirings in the semiconductor integrated circuit 10 is shown in FIG. 13.

The third layout is one for describing an example that has various global signal wirings pass obliquely over a single function block as long as the wiring length limitation allows. It should be noted that the third layout, as with the second layout, is not limited to only global signal wiring, and may be applied to a layout for signal wiring and power supply wiring arranged between function blocks.

With the semiconductor integrated circuit 10 shown in FIG. 13, a function block 2 is arranged in the upper left corner upon the substrate 1, and input/output buffering cells 5 are arranged along the first side (left side) 2a and the second side (upper side) 2b of the function block 2.

Signal wirings 4O and 4P, which extend to the lower side, pass obliquely over the function block 2 from upper left to lower right, and then extend to the right side, are connected to an input/output buffering cell 5C arranged on the upper side. Since the driving capability of the output circuit of the input/output buffering cell 5C is typically higher than that of the output of a logic circuit in the function block 2 not shown in the drawing, a buffering cell 3 is not particularly necessary near the second side 2b of the function block 2 when passing over the function block 2 directly from the input/output buffering cell 5C. The signal wiring 40a of the signal wiring 4O that passes over the function block 2 is arranged obliquely from the second side 2b towards the third side 2c, connecting to the buffering cell 30a. The signal wiring 41a of the signal wiring 4P that passes over the function block 2 is arranged obliquely from the second side 2b towards the third side 2c, connecting to the buffering cell 31a.

Meanwhile, signal wirings 4Q, 4R and 4S, which extend to the right side, pass obliquely over the same function block 2 from upper left to lower right, and then extend to the lower side, are connected to an input/output buffering cell 5D arranged on the left side. A buffering cell 3 is not particularly necessary near the first side 2a of the function block 2. The signal wiring 40a of the signal wiring 4Q that passes over the function block 2 is arranged obliquely from the first side 2a towards the fourth side 2d, connecting to the buffering cell 30a. Similarly, the signal wiring 41a of the signal wiring 4R that passes over the function block 2 is arranged obliquely from the first side 2a towards the fourth side 2d, connecting to the buffering cell 31a. The signal wiring 42a of the signal wiring 4S that passes over the function block 2 is arranged obliquely from the first side 2a towards the fourth side 2d, connecting to the buffering cell 32a.

It should be noted that in FIG. 13, a signal wiring (or global signal wiring) 4T extends towards the right side from an input/output buffering cell 5F arranged on the upper side, and a signal wiring (or global signal wiring) 4U extends toward the lower side from an input/output buffering cell 5E arranged on the left side. These signal wirings 4T and 4U are orthogonal wirings, but however do not pass obliquely over the function block 2 so as to satisfy the constraint for the wiring length.

With the semiconductor integrated circuit 10 according to the first embodiment configured in this manner, the same results as with the second layout may be obtained, as well as arranging multiple types of global signal wirings including the signal wirings 4O and 4P, which pass obliquely over the upper right corner of the function block 2, and the signal wirings 4Q, 4R, and 4S, which pass obliquely over the lower left corner.

Semiconductor Integrated Circuit Fabrication Method

Figure 14:
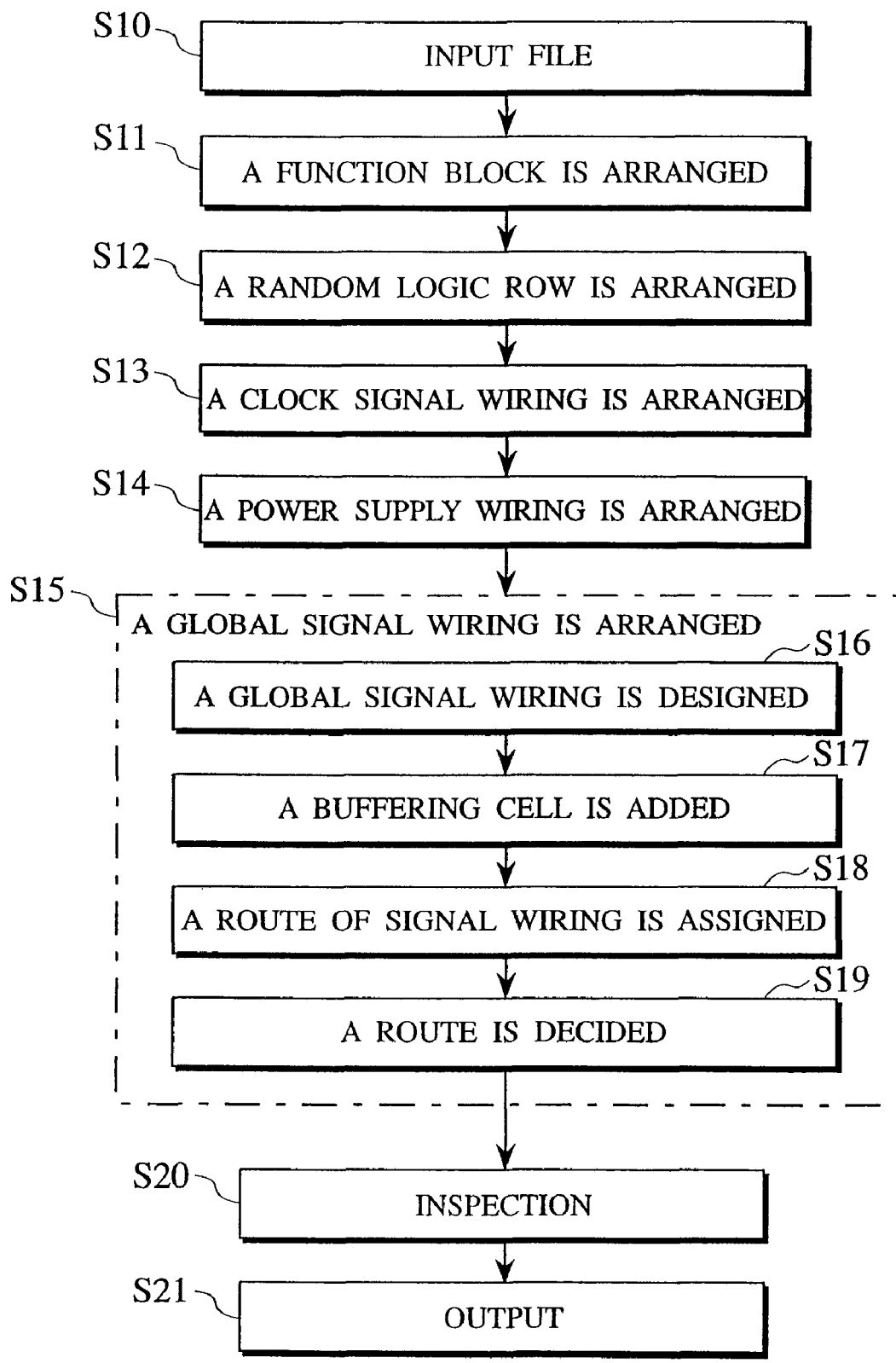
FIG. 14 is a flowchart for explaining a fabrication method of the semiconductor integrated circuit according to the first embodiment of the present invention.
Figure 15:
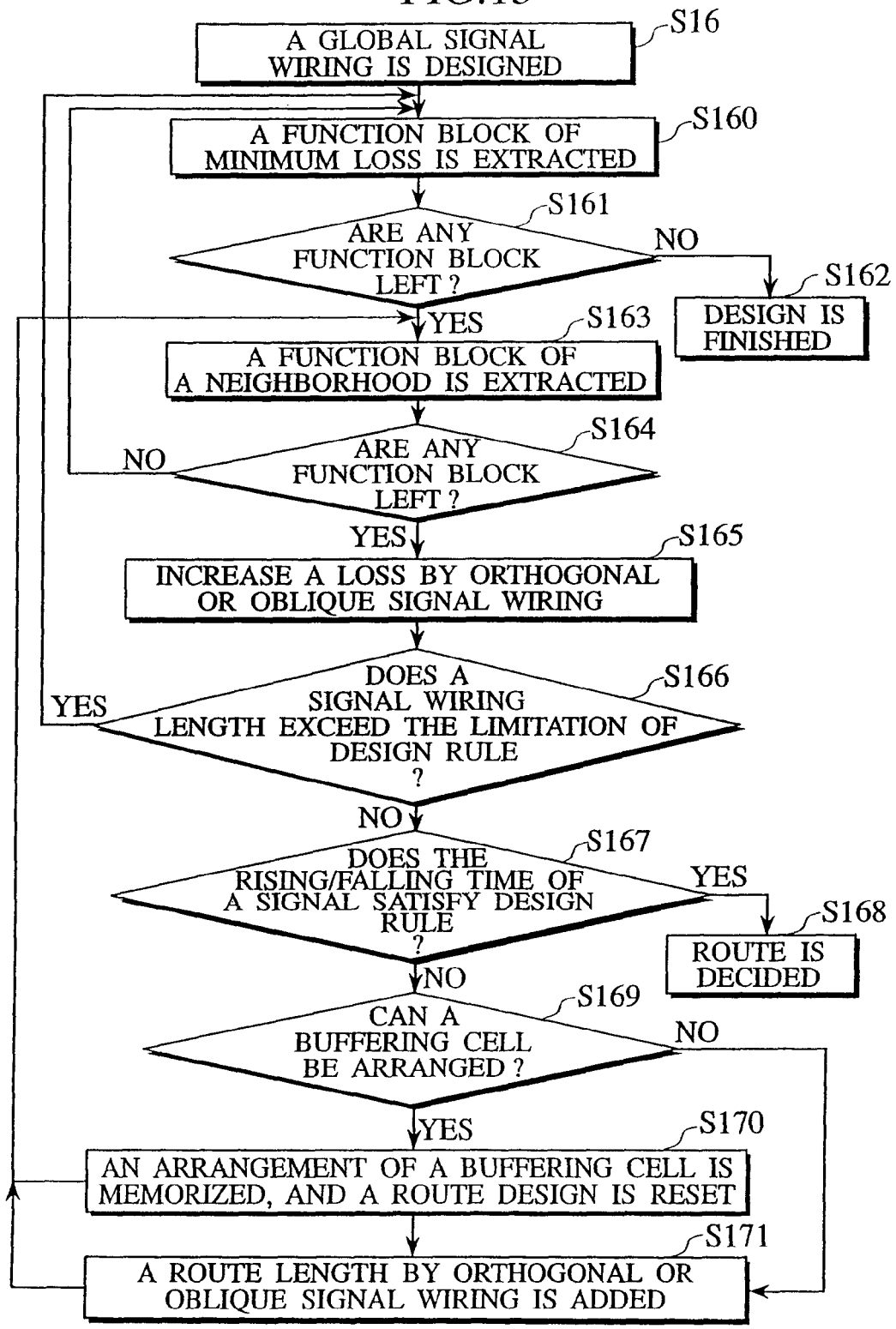
FIG. 15 is a flowchart for explaining a substantial part of the fabrication method of the semiconductor integrated circuit according to the first embodiment of the present invention.
Figure 16:
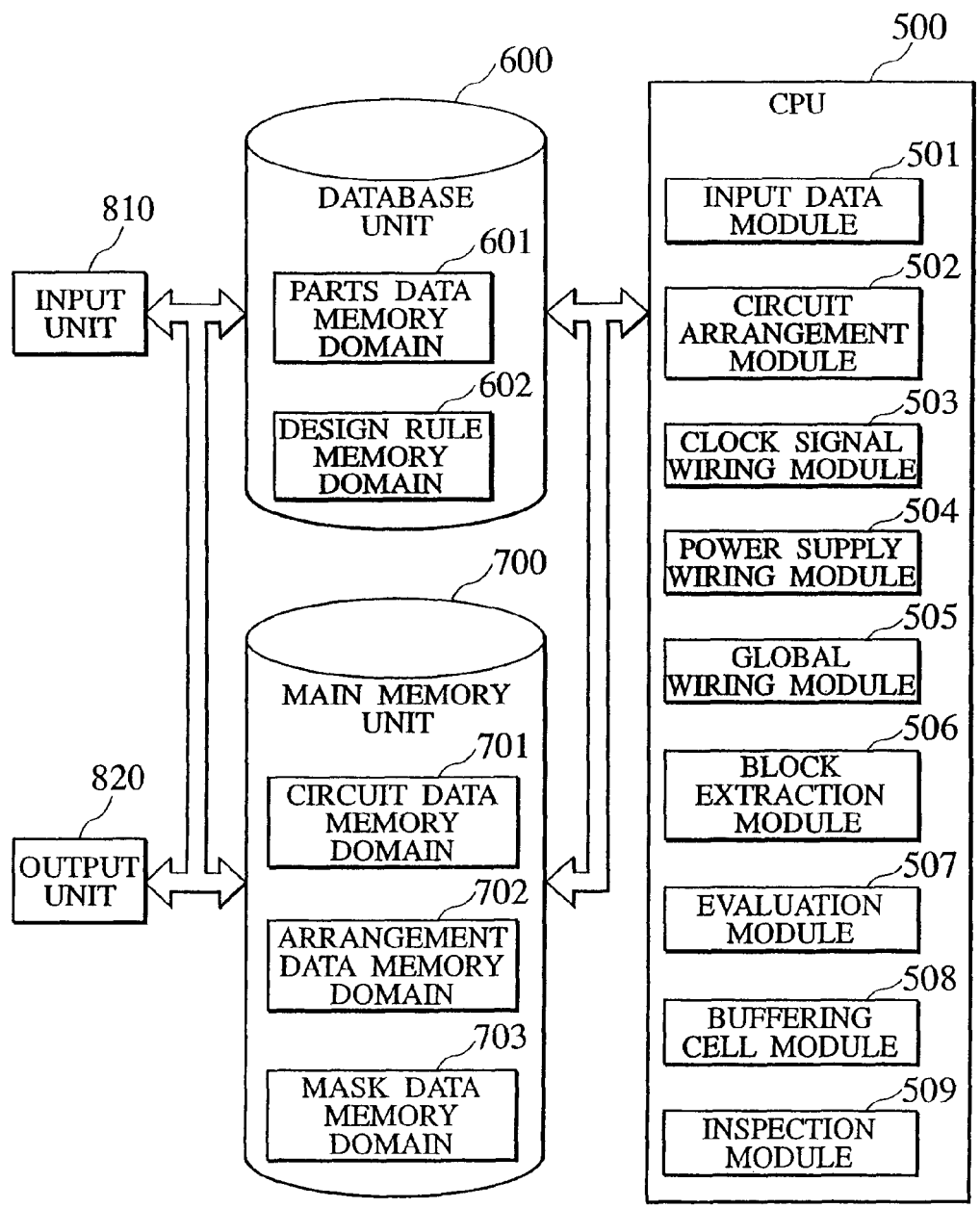
FIG. 16 is a view showing schematic circuit configuration of a CAD system executing the fabrication method of the semiconductor integrated circuit according to the first embodiment of the present invention.

An example of a fabrication method of the semiconductor integrated circuit 10, particularly a fabrication method of the semiconductor integrated circuit 10, which includes a global signal wiring fabrication method using a CAD system, is described referencing the flowcharts shown in FIG. 14 and FIG. 15, and a configuration of the CAD system shown in FIG. 16.

The CAD system shown in FIG. 16 includes a CPU 500, a database unit 600, a main memory unit 700, an input unit 810, and an output unit 820. Moreover, the CPU 500 includes an input data module 501, a circuit arrangement module 502, a clock signal wiring module 503, a power supply wiring module 504, a global wiring module 505, a block extraction module 506, an evaluation module 507, a buffering cell module 508, and an inspection module 509. The input data module 501 creates input files by reading out necessary data from the database unit 600 and the main memory unit 700 in order for the CAD system to make a photo mask (reticle). The circuit arrangement module 502 arranges function blocks and the like based on the input file information. The clock signal wiring module 503 arranges clock signal wiring. The power supply wiring module 504 arranges power supply wiring. The global wiring module 505 arranges global signal wiring. The block extraction module 506 extracts circuit blocks existing along a global signal wiring route. The evaluation module 507 evaluates the global signal wiring based on a predetermined design rule. The buffering cell module 508 determines whether or not to arrange a buffering cell along a global signal wiring route. The inspection module 509 inspects electrical characteristics of global signal wiring. The database unit 600 includes a parts data memory domain 601 and a design rule memory domain 602. The parts data memory domain 601 stores parts data information for circuit blocks and the like. The design rule memory domain 602 stores predetermined design rules for circuit arrangement and wiring. The main memory unit 700 includes a circuit data memory domain 701, an arrangement data memory domain 702, and a mask data memory domain 703. The circuit data memory domain 701 stores information for designing semiconductor integrated circuits. The arrangement data memory domain 702 stores arrangement information for semiconductor integrated circuit being designed. The mask data memory domain 703 stores information for circuit arrangements and wiring and the like generated by the CAD system.

With the CAD system shown in FIG. 16, information necessary for designing the semiconductor integrated circuit, which is input through the input unit 810, is stored in the database unit 600 and the main memory unit 700. The CPU 500 can perform circuit arrangement and wiring that satisfies design rules, store information necessary for making the photo masks (reticles) in the main memory unit 700, and retrieve it through the output unit 820.

(1) To begin with, various information stored in the database unit 600 and the main memory unit 700 through the input unit 810 necessary for designing the semiconductor integrated circuit is read by the input data module 501, creating an input file (S10). The created input file is stored in the arrangement data memory domain 702.

(2) The circuit arrangement module 502 reads circuit information stored in the arrangement data memory domain 702, arranging a function block 2 upon the substrate 1 (see the layout for the semiconductor integrated circuit 10 shown in FIG. 6). In this case, a function block includes at least a mega cell, as mentioned earlier.

(3) Next, the circuit arrangement module 502 uses as the random logic rows 6 a region in which the function block 2 is not arranged upon the substrate 1, arranging a logic circuit in these random logic rows 6 (S12).

(4) The clock signal wiring module 503 reads out the circuit information stored in the arrangement data memory domain 702, arranging a clock signal wiring upon the substrate 1 (S13). The clock signal wiring is arranged prior to power supply wiring and signal wiring in order to allow the system to operate at a high speed. It is practical to arrange the clock signal wiring using the top wiring layer, which cannot be easily restricted by the layout.

(5) The power supply wiring module 504 reads the circuit information stored in the arrangement data memory domain 702, arranging a power supply wiring upon the substrate 1 (S14). The power supply wiring is typically arranged with one set of a reference power supply wiring $V_{ss}$, which supplies a circuit reference power supply of 0V, for example, and an operating power supply wiring $V_{dd}$, which supplies a circuit operating power supply of 3.3V to 5V, for example. The power supply wiring is arranged, for example, in the second wiring layer as a fixed pattern extending along the outer edge of the substrate 1 on the input/output buffering cells 5. Furthermore, the power supply wiring is arranged, for example, in the second wiring layer on the random logic rows 6 in the basic cell arranging direction. Moreover, the power supply wiring is arranged in a large area, which includes the areas on the function block 2 and the random logic rows 6 in the substrate 1, and which is arranged in a relatively higher wiring layer which is a lower than the clock signal wiring layer.

(6) Next, the global wiring module 505 reads the circuit information stored in the arrangement data memory domain 702, arranging a global signal wiring (S15). Global signal wiring arrangement begins with the design of a global signal wiring route including at least the arrangement of orthogonal signal wiring typically arranged in either the X direction or the Y direction, arrangement of oblique signal wiring 4, and arrangement of buffering cells 3 (S16). As shown in FIG. 15, to begin with, in the route of the global signal wirings, a function block 2 with minimum signal loss is extracted by the block extraction module 506 (S160). It is then determined whether or not a function block 2 with minimum signal loss exists (S161). If a function block 2 with minimum signal loss does not exist, this global signal wiring routing design concludes (S162). If a function block 2 with minimum signal loss exists, an arbitrary function block 2 existing near the function block 2 with minimum signal loss is extracted by the block extraction module 506 (S163). The signal loss due to this function block 2 is greater than the minimum signal loss. If a function block 2 does not exist, a function block 2 with minimum signal loss is once again extracted (S160). If a function block 2 exists, the increased amount of signal loss due to arranging orthogonal signal wirings around this function block 2, or arranging oblique signal wirings passing over the function block 2 is calculated by the evaluation module 507, and then added to the arrangement data memory domain 702 (S165). The evaluation module 507 then reads from the design rule memory domain 602 the design rule for global signal wiring length, and when a buffering cell 3 is not arranged, determines whether or not the orthogonal signal wirings or the oblique signal wirings exceed the signal wiring length limitation (S166). If the signal wiring length exceeds the limitation, a function block 2 with minimum signal loss is once again extracted (S160). If the signal wiring length does not exceed the limitation, the evaluation module 507 reads the design rule for signal rising/falling times from the design rule memory domain 602, and determines whether or not the signal rising/falling times on the orthogonal signal wirings or the oblique signal wirings satisfy the design rule, namely whether or not a timing error occurs (S167). If the design rule is satisfied and a timing error does not occur, the signal wiring route is decided, and this global signal wiring routing design is concluded (S168). If the design rule is not satisfied and a timing error occurs, the buffering cell module 508 determines whether or not a buffering cell 3 can be arranged (S169). If the buffering cell 3 can be arranged, the arrangement position of the buffering cell 3 for the signal wiring route being designed is stored as a final point in the arrangement data memory domain 702, and this global signal wiring routing design is reset at the same time (S170). A single function block 2 is then extracted again (S163), and the same processing is repeatedly executed until a single function block 2 can no longer be extracted. Meanwhile, if the buffering cell 3 cannot be arranged, orthogonal signal wirings or oblique signal wirings are added to the current signal wiring route being designed, and stored in the arrangement data memory domain 702 (S171). A single function block 2 is then extracted again (S163), and the same processing is repeatedly executed. Based on the layout information for the buffering cell 3 stored in the arrangement data memory domain 702, as shown in FIG. 14, the buffering cell 3 is additionally arranged along the global signal wiring route by the global wiring module 505 (S17). The global wiring module 505 designates a route for the global signal wiring including oblique signal wiring created based on the global signal wiring design (S18). The final route for this global signal wiring is decided (S19), and the global signal wiring is arranged.

(7) Electrical characteristics such as a timing error of the arranged global signal wiring are inspected by the inspection module 509 (S20).

(8) If there are no defects as a result of the inspection, arrangement information for function blocks 2, random logic rows 6, clock signal wiring, power supply wiring, or global signal wiring are stored in the mask data memory domain 703 (S21).

(9) Based on the information created by the CAD system described above and stored in the mask data memory domain 703, semiconductor integrated circuit 10 photo masks (reticles) are made.

(10) Using the photo masks, the semiconductor integrated circuit 10 according to the first embodiment can be completed upon an actual substrate 1 by executing various fabrication processes such as photolithography, etching and film deposition.

With the fabrication method of the semiconductor integrated circuit 10 according to the first embodiment described above, since the global signal wiring that pass obliquely over the function block 2, and the buffering cells 3 may be easily configured utilizing the CAD system, the time necessary for development of the semiconductor integrated circuit 10 to product completion may be shortened.

Second Embodiment

A second embodiment of the present invention is one for describing an example that comprises a buffering cell 3 in a function block 2 and a global signal wiring 4 to pass obliquely over the function block 2 inside of the semiconductor integrated circuit 10 according to the first embodiment.

Figure 17:
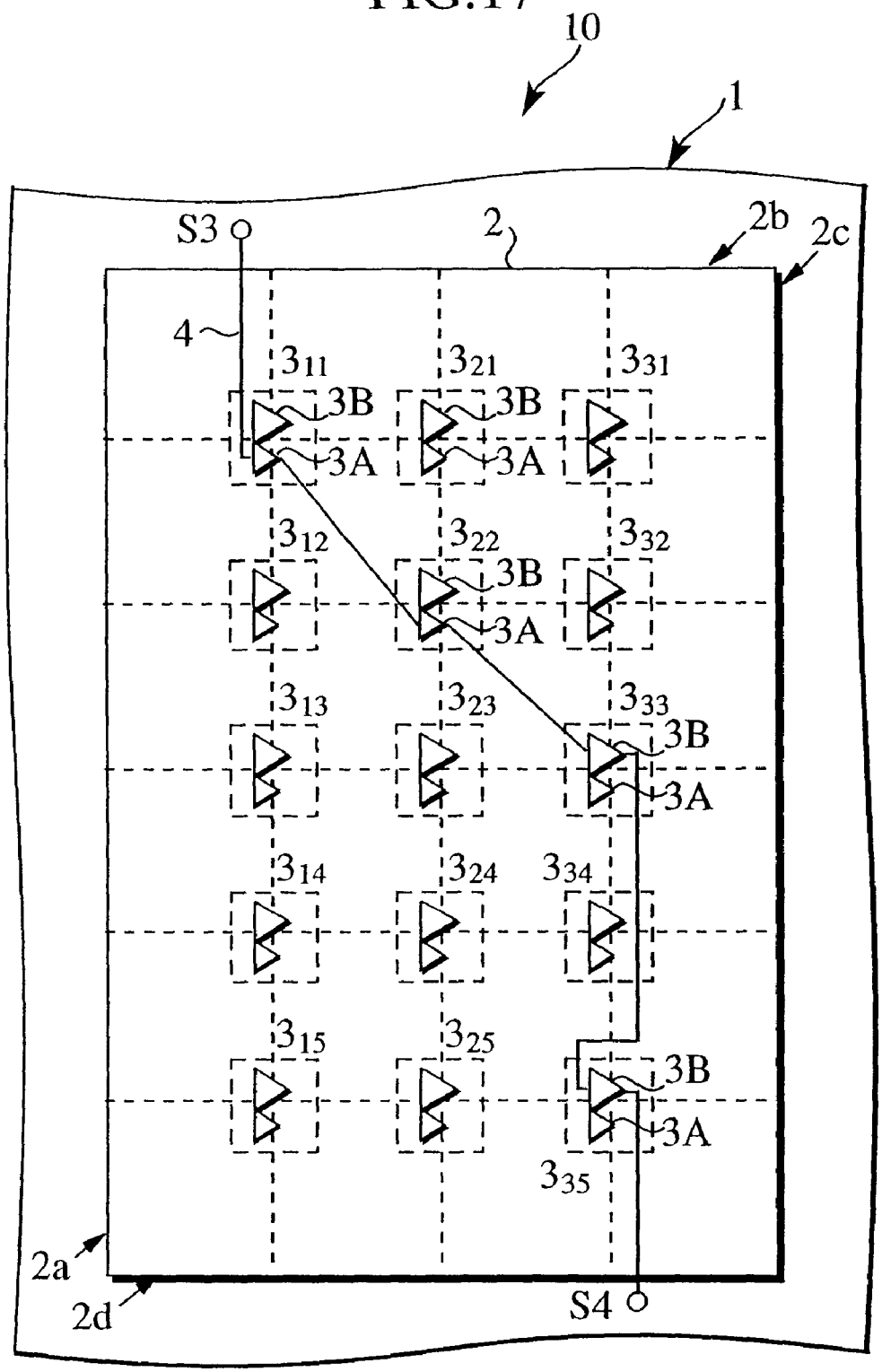
FIG. 17 is a schematic view showing a configuration of a function block of a semiconductor integrated circuit according to a second embodiment of the present invention.

As shown in FIG. 17, the semiconductor integrated circuit 10 according to the second embodiment comprises a function block 2 upon a substrate 1, a plurality of buffering cells $3(3_{11}-3_{35})$ arranged in the function block 2 regularly inside at an appointed interval, and the global signal wiring 4 at least one part of which extends in the direction oblique to the side of the function block 2 and is connected between adjacent buffering cells 3.

The buffering cell 3 is arranged in the function block 2 beforehand, and it is used appropriately when it is necessary for the global signal wiring 4 to pass. In FIG. 17, a broken line is added for convenience to explain intelligibly an arrangement layout of the buffering cell 3, but there is not a broken line on the function block 2 of the semiconductor integrated circuit 10 of the real product. On a monitor screen of a CAD system, the broken line as grid can be displayed in order to do a design easily. In the second embodiment, the buffering cell 3 is arranged at an interval by an X direction and a Y direction. In other words, the buffering cell 3 is arranged at a crossing (coordinates) of the broken line arranged at intervals of each in an X direction and a Y direction, or in each corner part of a square sectioned in the broken line.

Furthermore, the buffering cell 3 according to the second embodiment comprises the first buffering cell 3A and the second buffering cell 3B whose drive ability differs from each other, as one set. Here, the first buffering cell 3A comprises the buffering cell 3 having the output inverter circuit 302 of one-step structure shown in FIG. 7A, for example. The second buffering cell 3B comprises the buffering cell 3 having output the inverter circuit 302 of two-step structure shown in FIG. 8A, for example. In other words, the second drive ability of the buffering cell 3B is stronger than the first buffering cell 3A.

In addition, the first buffering cell 3A may comprise the buffering cell 3 shown in FIG. 8A or FIG. 9A, the second buffering cell 3B may comprise the buffering cell 3 shown in FIG. 9A or FIG. 10. Furthermore, in the first buffering cell 3A and the second buffering cell 3B, the number of steps of output inverter circuit 302 are made the same, and by means of changing a gate width of IGFET Q of the inverter circuit 302, a drive ability may be adjusted.

As shown in FIG. 17, the global signal wiring 4 passes the buffering cell $3_{11}, 3_{22}, 3_{33},$ and $3_{35}$ respectively, and connects a input terminal S3 arranged by the second side (appearances) 2b of the function block 2 and the output terminal S4 arranged on the fourth side (a lower side) 2d of the function block 2. In other words, the global signal wiring 4 extends from the input terminal S3 to the lower side (Y direction), connecting to the buffering cell $3_{11}$ at first. The first buffering cell 3A is used for this buffering cell $3_{11}$ because it does not need a strong drive ability so that a distance from the next buffering cell $3_{22}$ can be comparatively short. And, the global signal wiring 4 extends from the buffering cell $3_{11}$ to the lower right side as a signal wiring which is inclined by an angle of 45 degrees relative to the second side 2b, connecting to the buffering cell $3_{22}$. The first buffering cell 3A is used for this buffering cell $3_{22}$ because it does not need a strong drive ability so that a distance from the next buffering cell $3_{33}$ can be comparatively short. Similarly, the global signal wiring 4 extends from buffering cell $3_{22}$ to the lower right side as a signal wiring which is inclined by an angle of 45 degrees relative to the second side 2b, connecting to the buffering cell $3_{33}$. The second buffering cell 3B is used for this buffering cell $3_{33}$ because it needs a strong drive ability so that a distance from the next buffering cell $3_{35}$ is comparatively long. Furthermore, the global signal wiring 4 extends from the buffering cell $3_{33}$ to the lower side (Y direction), connecting to the buffering cell $3_{35}$. The second buffering cell 3B is used for this buffering cell $3_{35}$ because it needs a strong drive ability to drive an outside circuit of function block 2 through the output side S4. And, the global signal wiring 4 extends from the buffering cell $3_{35}$ to the lower side (Y direction), connecting to the output terminal S4.

With the semiconductor integrated circuit 10 according to the second embodiment configured in this manner, the global signal wiring 4 can pass over the function block 2 of a huge size more than a limit of wiring length, by using a plurality of buffering cells 3 arranged in the function block 2 regularly as intermediate cells.

Furthermore, a route of the global signal wiring 4 to pass over the function block 2 can be predicted easily by having cells 3 arranged regularly. Therefore, by arranging the electric shield layer on a route of the global signal wiring 4 to pass the function block 2 beforehand, an electric interference between the function block 2 and the global signal wiring 4 to pass over the function block 2 can be minimized.

Furthermore, by using an oblique signal wiring with more than one in connection of the buffering cells 3 in the function block 2, bypassing signal wiring in the function block 2 is reduced, and route length of the global signal wiring 4 can be shortened.

With the semiconductor integrated circuit 10 according to the second embodiment, the buffering cells 3 in the function block 2 may be arranged at positions corresponding to each corner part such as in a triangle, hexagon, not only a square sectioned by the broken line which is added in convenience. In addition, the buffering cells 3 may comprise more than three buffering cells, and are not limited to being the first buffering cell 3A and the second buffering cell 3B.

Third Embodiment

A third embodiment of the present invention is described using an example that prevents cross talk between global signal wirings passing over the function block 2 in the semiconductor integrated circuit 10 according to the first embodiment.

Figure 18:
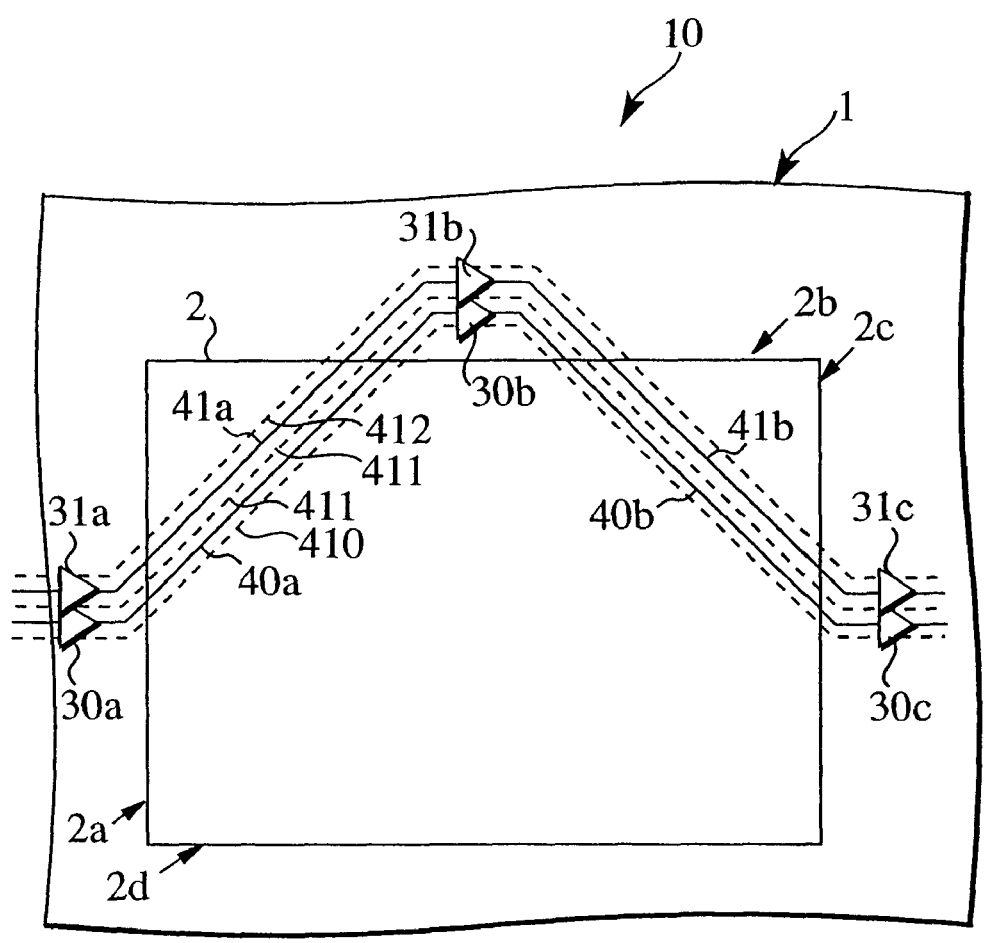
FIG. 18 is a schematic view showing a basic structure of a semiconductor integrated circuit according to a third embodiment of the present invention.

As shown in FIG. 18, the semiconductor integrated circuit 10 according to the third embodiment comprises a wave guide 410 and 411 that are arranged adjacent to a signal wiring 40a and 40b passing over the function block 2 obliquely, extending substantially parallel to a signal wiring 40a and 40b. A fixed power supply is supplied in the wave guide 410 and 411. Furthermore, the semiconductor integrated circuit 10 according to the third embodiment comprises the wave guide 411 and 412 that are arranged adjacent to the signal wiring 41a and 41b passing over the function block 2 obliquely, extending substantially parallel to the signal wiring 41a and 41b. A fixed power supply is supplied in the wave guide 411 and 412.

The signal wiring 40a and 40b and the signal wiring 41a and 41b are global signal wirings and used as a bus, for example. By arranging the wave guide 410 along one side of signal wiring 40a and 40b (bottom in a figure), and arranging wave guide 411 along another side (the upper part in a figure), there can be a layout which arranges signal wiring 40a and 40b between wave guide 410 and 411. Similarly, by arranging the wave guide 411 along one side of signal wiring 41a and 41b (bottom in a figure), and arranging the wave guide 412 along another side (the upper part in a figure), there can be a layout which arranges signal wiring 41a and 41b between wave guide 411 and 412.

The signal wiring 40a and 41a and the wave guide 410 to 412 which is arranged in parallel to the signal wiring 40a and 41a, are set in the same wiring layer to reduce electric interference between the signal wiring 40a and 41a. And it is desirable for width of the wave guide 410 to 412 not to exceed a thickness of the wave guide 410 to 412 in order to keep down an occupation area to a minimum. Similarly, the signal wiring 40b and 41b and the wave guide 410 to 412, arranged in parallel to the signal wiring 40a and 41a, are set in the same wiring layer. The wiring layer in which the signal wiring 40a and 41a is arranged is basically different from the wiring layer in which the signal wiring 40b and 41b is arranged.

In addition, on a database of a CAD system, the wave guide 410 to 412 are built in beforehand by data of the global signal wiring. In other words, the wave guide 410 to 412 can be designed at the same time as designing the global signal wiring. It is not necessary to design the wave guide 410 to 412 after designing the global signal wiring. It is practical to supply 0V that has a reference power supply $V_{ss}$ in the wave guide 410 to 412, for example.

With the semiconductor integrated circuit 10 according to the third embodiment configured in this manner, since the wave guide 411 is arranged between the signal wiring 40a and 40b and between the signal wiring 41a and 41b at least, occurrence of electric interference, namely cross talk, can be reduced.

Other Embodiments

As described above, the semiconductor integrated circuit 10 according to the first through third embodiments comprises the function block 2 arranged on substrate 1 (semiconductor wafer, a semiconductor chip, etc) comprising of a silicon single crystal, and the global signal wiring passing over the function block 2. These embodiment can be applied to the semiconductor integrated circuit (a system board, a mother board, a logic board, a memory board, etc) which comprises a wiring substrate in which a semiconductor integrated circuit 10 considered to be the function block 2 is included and the global signal wiring passes over the wiring substrate. A printed circuit board (PCB), a ceramics substrate, a carbonization silicon substrate, a glass substrate or the like can be used practically for the wiring substrate.

Various modifications will become possible for those skilled in the art after receiving the teachings of the present disclosure without departing from the scope thereof.

What is claimed is:

1. A semiconductor integrated circuit comprising:
   a function block arranged on a substrate;
   a plurality of buffering cells arranged regularly in the function block at an appointed interval, the plurality of buffering cells including a first buffering cell type and a second buffering cell type fabricated via an insulated gate field effect transistor (IGFET) fabrication process, wherein, by changing gate width of transistors as between the first buffering cell type and the second buffering cell type during the IGFET fabrication process, a second drive ability of the second buffering cell type is set higher than a first drive ability of the first buffering cell type; and
   a signal wiring extending obliquely relative to a side of the function block, the signal wiring being connected between adjacent buffering cells selected from among the plurality of buffering cells with the signal wiring being driven to a subsequent cell by either a first buffering cell or a second buffering cell, wherein the signal wiring is arranged substantially in an entire area on the substrate and passes over the function block;
   wherein use of either the first buffering cell or the second buffering cell to drive the signal wiring is determined as a function of distance to the subsequent cell, with the first buffering cell type being used to drive the signal wiring over a distance correlated to nearby cells and the second buffering cell type being used to drive the signal wiring to cells at distances further away than the distance to the nearby cells.

2. The semiconductor integrated circuit of claim 1, wherein the signal wiring is a global signal wiring including one of a data bus and an address bus and passes over the function block.

3. The circuit of claim 1, further comprising:
   a first signal wiring extending in an X direction, the first signal wiring extending obliquely relative to the signal wiring; and
   a second signal wiring extending in a Y direction, the second signal wiring being perpendicular to the first signal wiring and extending obliquely relative to the signal wiring,
   wherein the first signal wring and the second signal wiring are intra-block wirings arranged inside the function block.

4. The circuit of claim 3, wherein the signal wiring is arranged in a layer above layers in which the first signal wiring and the second signal wiring are arranged.

5. The circuit of claim 3, wherein the signal wiring has an intersecting angle of either about 45 degrees or about 135 degrees relative to the first signal wiring and the second signal wiring.

6. The circuit of claim 1, further comprising a first buffering cell and a second buffering cell arranged outside of the function block.

7. The circuit of claim 1, further comprising a wave guide arranged adjacent to the signal wiring and extending substantially parallel to the signal.

8. The circuit of claim 1, further comprising:
   a first signal wiring extending in an X direction, the first signal wiring extending obliquely relative to the signal wiring; and
   a second signal wiring extending in a Y direction, the second signal wiring being perpendicular to the first signal wiring and extending obliquely relative to the signal wiring,
   wherein the first signal wring and the second signal wiring are intra-block wirings arranged inside the function block.

9. The circuit of claim 8, wherein the signal wiring is arranged in a layer above layers in which the first signal wiring and the second signal wiring are arranged.

10. The circuit of claim 1, wherein the signal wiring is a global signal wiring including one of a data bus and an address bus.

11. The circuit of claim 1, wherein the first buffering cell and the second buffering cell are arranged outside of the function block.

12. The circuit of claim 1, further comprising a wave guide arranged adjacent to the signal wiring and extending substantially parallel to the signal.

13. The circuit of claim 2, further comprising:
   a first signal wiring extending in an X direction, the first signal wiring extending obliquely relative to the signal wiring; and
   a second signal wiring extending in a Y direction, the second signal wiring being perpendicular to the first signal wiring and extending obliquely relative to the signal wiring, wherein the first signal wring and the second signal wiring are intra-block wirings arranged inside the function block.

14. The circuit of claim 13, wherein the signal wiring is arranged in a layer above layers in which the first signal wiring and the second signal wiring are arranged.

15. The circuit of claim 2, wherein the first buffering cell and the second buffering cell are arranged outside of the function block.

16. The circuit of claim 2, further comprising a wave guide arranged adjacent to the signal wiring and extending substantially parallel to the signal.

17. The circuit of claim 1 wherein the plurality of buffering cells are arranged in the function block regularly as intermediate cells, and wherein, by using the global signal wiring routed through the regularly arranged intermediate cells, the global signal wiring is configured to pass over function blocks larger than a limit of wiring length.

18. The circuit of claim 1 wherein, by configuring the plurality of buffering cells in a regular array of intermediate cells and arranging an electric shield layer on a route of the global signal wiring to pass the function block, electric interference between the function block and the global signal wiring passing over the function block is reduced.

19. The circuit of claim 1 wherein the plurality of buffering cells are coupled via oblique signal wiring with more than one connection in the buffering cells, such that the signal wiring that bypasses the function block is reduced and route length of the global signal wiring is shortened.

20. The circuit of claim 1 wherein the signal wiring is arranged in a layer in which the function block is arranged only in vicinity around each of the buffering cells, and arranged in another layer above the layer in which the function block is arranged outside of the vicinity around each of the buffering cells.

21. A method for manufacturing a semiconductor integrated circuit comprising:
arranging a function block on a substrate;
fabricating a plurality of buffering cells arranged regularly in the function block at an appointed interval, the plurality of buffering cells including a first buffering cell type and a second buffering cell type fabricated via an insulated gate field effect transistor (IGFET) fabrication process, wherein, by changing gate width of transistors as between the first buffering cell type and the second buffering cell type during the IGFET fabrication process, a second drive ability of the second buffering cell type is set higher than a first drive ability of the first buffering cell type;
arranging a signal wiring which passes over the function block obliquely relative to a first side and a second side adjacent to the first side of the function block, wherein the signal wiring being connected between adjacent buffering cells selected from among the plurality of buffering cells with the signal wiring being driven to a subsequent cell by either a first buffering cell or a second buffering cell, and the signal wiring being arranged substantially in an entire area on the substrate; and
arranging a first buffering cell connected to one end of the signal wiring, adjacent to the first side of the function block and a second buffering cell connected to another end of the signal wiring, adjacent to the second side of the function block;
wherein use of either the first buffering cell or the second buffering cell to drive the signal wiring is determined as a function of distance to the subsequent cell, with the first buffering cell type being used to drive the signal wiring over a distance correlated to nearby cells and the second buffering cell type being used to drive the signal wiring to cells at distances further away than the distance to the nearby cells.

* * * * *